US007799416B1

(12) United States Patent
Chan et al.

(10) Patent No.: US 7,799,416 B1
(45) Date of Patent: Sep. 21, 2010

(54) PERIODIC POROUS AND RELIEF NANOSTRUCTURED ARTICLES

(75) Inventors: Vanessa Z. H. Chan, Ulm (DE); Edwin L. Thomas, Natick, MA (US); Victor Y. Lee, San Jose, CA (US); Robert D. Miller, San Jose, CA (US); Apostolos Avgeropoulos, Athens (GR); Nikos Hadjichristidis, Athens (GR)

(73) Assignees: Massachusetts Institute of Technology, Cambridge, MA (US); International Business Machines Corporation, Armonk, NY (US)

( * ) Notice: Subject to any disclaimer, the term of this patent is extended or adjusted under 35 U.S.C. 154(b) by 850 days.

(21) Appl. No.: 09/720,710

(22) PCT Filed: Jul. 2, 1999

(86) PCT No.: PCT/US99/15068

§ 371 (c)(1),
(2), (4) Date: Jun. 1, 2001

(87) PCT Pub. No.: WO00/02090

PCT Pub. Date: Jan. 13, 2000

Related U.S. Application Data

(66) Substitute for application No. 60/091,676, filed on Jul. 2, 1998.

(51) Int. Cl.
*B32B 3/26* (2006.01)
*B32B 3/00* (2006.01)
*C08F 30/08* (2006.01)
*C08F 236/00* (2006.01)

(52) U.S. Cl. .............. 428/304.4; 428/312.2; 428/312.6; 526/279; 526/340

(58) Field of Classification Search .............. 428/304.4, 428/312.2, 312.6; 526/279, 340
See application file for complete search history.

(56) References Cited

U.S. PATENT DOCUMENTS 3,928,490 A    12/1975    Hergenrother (Continued)

FOREIGN PATENT DOCUMENTS

WO        WO 96/27225 A1    9/1996

(Continued)

OTHER PUBLICATIONS

R.J.Albalak & E.L. Thomas, "Microphase separation of block copolymer solutions in a flow field," J. Poly. Sci.: Part B: Polymer Physics, vol. 31, pp. 37-46, 1993.

(Continued)

*Primary Examiner*—Victor S Chang
(74) *Attorney, Agent, or Firm*—Wolf, Greenfield & Sacks, P.C.

(57) ABSTRACT

The current invention involves periodically ordered nanostructured materials and methods of using and modifying the materials. In some embodiments, the invention provides periodically structured microphase separated polymeric articles that include periodically occurring separate domains. The polymeric species comprising one or more of the domains, for some embodiments, contains an inorganic species capable of forming an inorganic oxide ceramic. In another aspect, the invention provides methods for modifying the polymeric articles by oxidation and/or radiation to form periodically structured porous and relief articles that, in some embodiments, include a ceramic oxide in their structure. The invention also provides methods of use for the novel articles and novel structures constructed utilizing the articles.

4 Claims, 18 Drawing Sheets

U.S. PATENT DOCUMENTS

| | | | |
|---|---|---|---|
| 4,233,427 A | | 11/1980 | Bargain et al. |
| 4,529,629 A | | 7/1985 | Liu |
| 4,585,670 A | | 4/1986 | Liu |
| 4,618,644 A | | 10/1986 | Liu |
| 4,634,501 A | * | 1/1987 | LeBlanc, Jr. ............. 205/780.5 |
| 4,761,464 A | | 8/1988 | Zeigler |
| 5,104,952 A | * | 4/1992 | Babu ......................... 526/279 |
| 5,281,370 A | | 1/1994 | Asher et al. |
| 5,296,574 A | | 3/1994 | Hoxmeier |
| 5,335,240 A | | 8/1994 | Ho et al. |
| 5,337,185 A | | 8/1994 | Meier et al. |
| 5,385,114 A | | 1/1995 | Milstein et al. |
| 5,389,943 A | | 2/1995 | Brommer et al. |
| 5,406,573 A | | 4/1995 | Ozbay et al. |
| 5,440,421 A | | 8/1995 | Fan et al. |
| 5,448,514 A | | 9/1995 | Cho et al. |
| 5,471,180 A | | 11/1995 | Brommer et al. |
| 5,526,449 A | | 6/1996 | Meade et al. |
| 5,594,070 A | | 1/1997 | Jacoby et al. |
| 5,600,483 A | | 2/1997 | Fan et al. |
| 5,622,668 A | | 4/1997 | Thomas et al. |
| 5,651,818 A | | 7/1997 | Milstein et al. |
| 5,661,092 A | | 8/1997 | Koberstein et al. |
| 5,688,318 A | | 11/1997 | Milstein et al. |
| 5,948,470 A | | 9/1999 | Harrison et al. |
| 6,049,419 A | | 4/2000 | Wheatley et al. |
| 6,433,931 B1 | | 8/2002 | Fink et al. |

FOREIGN PATENT DOCUMENTS

| | | |
|---|---|---|
| WO | WO 96/29621 A1 | 9/1996 |
| WO | WO 97/01440 A1 | 1/1997 |
| WO | WO 98/35248 A1 | 8/1998 |
| WO | WO 00/02090 A2 | 1/2000 |

OTHER PUBLICATIONS

A. Avgeropoulos et al., "Tricontinuous double gyroid cubic phase in triblock copolymers of the ABA type," Macromolecules, vol. 30, No. 19, pp. 5634-5642, 1997.

F. S. Bates & G.H. Fredrickson, "Block copolymers-designer soft materials," Physics Today, Feb. 1999, pp. 32-38.

J.T. Chen et al., "Theoretical prediction of the optical waveguiding properties of self-assembled block copolymer films," Macromolecules, vol. 28, pp. 5811-5818, 1995.

J.T. Chen et al., "Self-assembled smectic phases in rod-coil block copolymers," Science, vol. 273, pp. 343-346, 1996.

J. Chu et al., "Morphologies of strongly segregated polystyrene-poly(dimethylsiloxane) diblock copolymers," Polymer, vol. 36, No. 8, pp. 1569-1575, 1995.

S. Fan et al., "Design of three-dimensional photonic crystals at submicron lengthscales," Appl. Phys. Lett., vol. 65, No. 11, pp. 1106-1108, 1994.

S. Förster & M. Antonietti, "Amphiphilic block copolymers in structure-controlled nanomaterial hybrids," Adv. Mater., vol. 10, No. 3, pp. 195-217, 1998.

A. Gabor et al., "Synthesis and lithographic characterization of block copolymer resists consisting of both poly(styrene) blocks and hydrosiloxane-modified poly(diene) blocks," Chem. Mater., vol. 6, pp. 927-934, 1994.

A.H. Gabor & C.K. Ober, Silicon-containing block copolymer resist materials, Microelectronics technology: Polymers for advanced imaging and packaging, ACS Symposium Series, E. Reichmanis et al., editors, vol. 614, chapter 19, pp. 281-298, 1995.

M.A. Hartney & A.E. Novembre, "Poly(methylstyrene-dimethylsiloxane) block copolymers as bilevel resists," SPIE, vol. 539, pp. 90-96, 1985.

T. Hashimoto et al., "Nanoprocessing based on bicontinuous microdomains of block copolymers: Nanochannels coated with metals," Langmuir, vol. 13, pp. 6869-6872, 1997.

E. Helfand & Z.R. Wasserman, "Microdomain structure and the interface in block copolymers," Developments in Block Copolymers, I.Goodman editor, Applied Science Publsihers, London 1982, vol. 1, chapter 4, pp. 99-125.

D.S. Herman et al., "A compositional study of the morphology of 18-armed poly(styrene-isoprene) star block copolymers," Macromolecules, vol. 20, No. 11, pp. 2940-2942, 1987.

A. Hirao et al., "Polymerization of monomers containing functional silyl groups. 12. Anionic polymerization of styrene derivatives para-substituted with pentamethyldisilyl (Si-Si), heptamethyltrisilyl (Si-Si-Si), and nonamethyltetrasily (Si-Si-Si-Si) groups," Macromol. Symp., vol. 95, pp. 293-301, 1995.

E. Huang et al., "Using surface active random copolymers to control the domain orientation in diblock copolymer thin films," Macromolecules, vol. 31, No. 22, pp. 7641-7650, 1998.

E. Huang et al., "Nanodomain control in copolymer thin films," Nature, vol. 395, pp. 757-758, 1998.

H. Ito et al., "Silicon-containing block copolymer membranes," Polymer, vol. 37, No. 4, pp. 633-637, 1996.

J. Joannopoulos et al., "Photonic crystals: Molding the flow of light," Princeton University Press, pp. 1-133, 1995.

G. Kim and M. Libera, "Morphological development in solvent-case polystyrene-polybutadiene-polystyrene (SBS) triblock copolymer thin films," Macromolecules, vol. 31, No. 8, pp. 2569-2577, 1998.

R.G.H. Lammertink et al., "Periodic organic-organometallic microdomain structures in poly(styrene-*block*-ferrocenyldimethylsilane) copolymers and blends with corresponding homopolymers," J. Poly. Sci.: Part B: Polymer Physics, vol. 37, pp. 1009-1021, 1999.

J. Lee et al., "Polymerization of monomers containing functional silyl groups. 5. Synthesis of new porous membranes with functional groups," Macromolecules, vol. 21, No. 1, pp. 274-276, 1988.

J. Lee et al., "Polymerization of monomers containing functional silyl groups. 7. Porous membranes with controlled microstructures," Macromolecules, vol. 22, No. 6, pp. 2602-2606, 1989.

G. Liu & J. Ding, "Diblock thin films with densely hexagonally packed nanochannels," Adv. Mater., vol. 10, No. 1, pp. 69-71, 1998.

G. Liu et al., "Potential skin layers for membranes with tunable nanochannels," Macromolecules, vol. 30, pp. 1851-1853, 1997.

P. Mansky et al., "Nanolithographic templates from diblock copolymer thin films," Appl. Phys. Lett., vol. 68, No. 18, pp. 2586-2588, 1996.

P. Mansky et al., "Monolayer films of diblock copolymer microdomains for nanolithographic applications," J. Mater. Sci., vol. 30, pp. 1987-1992, 1995.

P. Mansky et al., "Large-area domain alignment in block copolymer thin films using electric fields," Macromolecules, vol. 31, No. 13, pp. 4399-4401, 1998.

J.A. Massey et al., "Organometallic nanostructures: Self-assembly of poly(ferrocene) block copolymers," Adv. Mater., vol. 10, No. 18, pp. 1559-1562, 1998.

M.S. Morey et al., "Silica-based, cubic mesostructures: Synthesis, characterization and relevance for catalysis," J. Porous Materials, vol. 5, pp. 195-204, 1998.

Y. Ni et al., "Transition metal-based polymers with controlled architectures: Well-defined poly(ferrocenylsilane) homopolymers and multiblock copolymers via the living anionic ring-opening polymerization of silicon-bridged [1]ferrocenophanes," J. Am. Chem. Soc., vol. 118, pp. 4102-4114, 1996.

K.H. Pannell et al., "Ferrocenyl containing polysilanes," Macromolecules, vol. 21, No. 1, pp. 276-278, 1988.

M. Park et al., "Block copolymer lithography: Periodic arrays of~$10^{11}$ holes in 1 square centimeter," Science, vol. 276, pp. 1401-1404, 1997.

S.H. Park & Y. Xia, "Macroporous membranes with highly ordered and three-dimensionally interconnected spherical pores," Adv. Mater., vol. 10, No. 13, pp. 1045-1048, 1998.

V. Sankaran et al., "Synthesis of zinc sulfide clusters and zinc particles within microphase-separated domains of organometallic block polymers," Chem. Mater., vol. 5, pp. 1133-1142, 1993.

B.H. Sohn et al., "Processible optically transparent block copolymer films containing superparamagnetic iron oxide nanoclusters," Chem. Mater., vol. 9, No. 1, pp. 264-169, 1997.

M. Templin et al., "Organically modified aluminosilicate mesostructures from block copolymer phases," Science, vol. 278, pp. 1795-1798, 1997.

E.L. Thomas & R.L. Lescanec, "Phase morphology in block copolymer systems," Philosophical Transactions: Physical Sciences and Engineering, vol. 348, No. 1686, pp. 149-164, 1994.

M. van Dijk et al., "Ordering phenomena in thin block copolymer fluid studied using atomic force microscopy," Macromolecules, vol. 28, pp. 6773-6778, 1995.

D. Zhao et al., "Nonionic triblock and star diblock copolymer and oligomeric surfactant syntheses of highly ordered, hydrothermally stable, mesoporous silica structures," J. Am. Chem. Soc., vol. 120, No. 24, pp. 6024-6036, 1998.

L. Zimmermann et al., "High refractive index films of polymer nanocomposites," J. Mater. Res., vol. 8, No. 7, pp. 1742-1748, 1993.

Hajduk, D.A. et al., "The Gyroid: A New Equilibrium Morphology in Weakly Segregated Diblock Copolymers," *Macromolecules* 1994, 27, 4063.

Kinning, D. J., et al., "Effect of Morphology on the Transport of Gases in Block Copolymers," *Macromolecules* 1987, 20, 1129.

Thomas E. L., et al., "Ordered Bicontinuous Double-Diamond Structure of Star Block Copolymers: A New Equilibrium Microdomain Morphology," *Macromolecules* 1986, 2197.

* cited by examiner

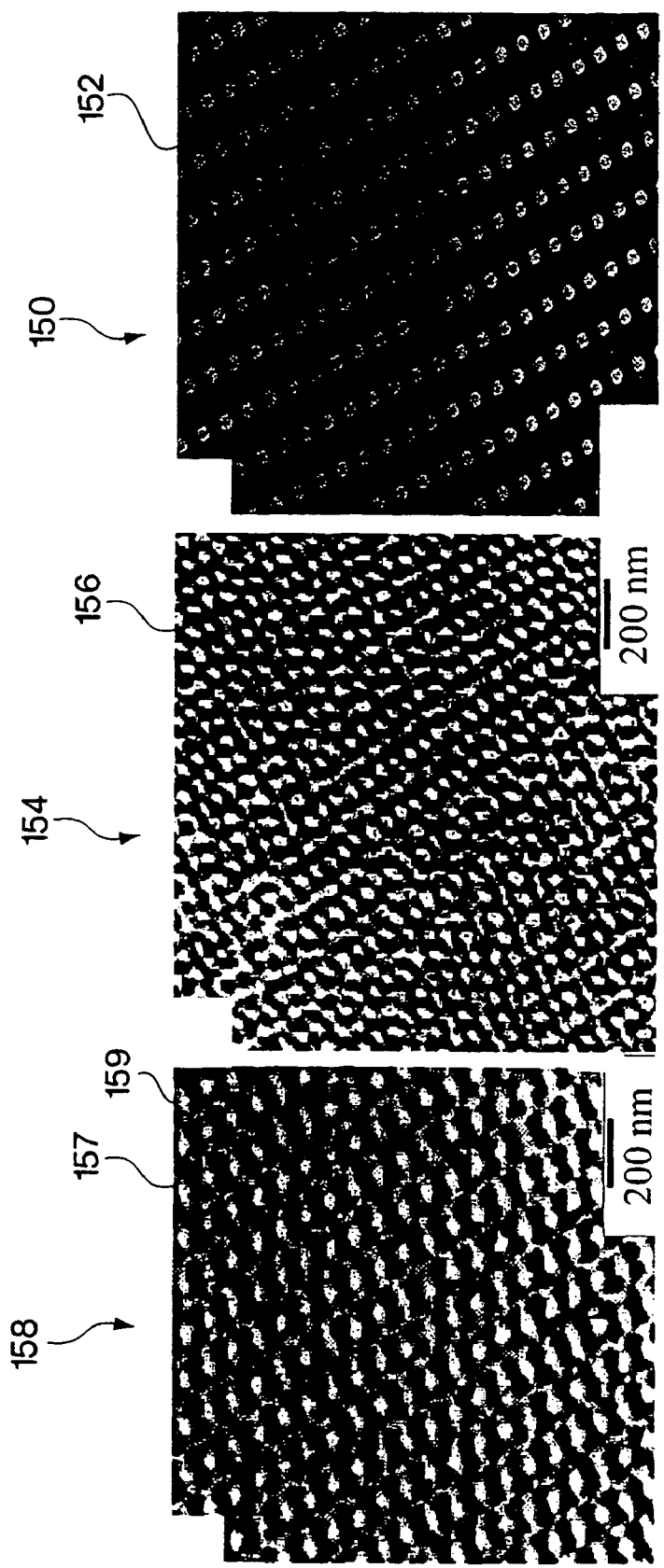

PERIODIC POROUS AND RELIEF NANOSTRUCTURED ARTICLES

RELATED APPLICATIONS

This application claims the benefit under 35 U.S.C. §120 or 35 U.S.C. §365(c) of PCT International application PCT/US99/15068, designating the United States of America, and filed Jul. 2, 1999, of which this application is a national stage filing under 35 U.S.C. §371, published under PCT Article 21(2) in English.

Application number PCT/US99/15068 claims the benefit under 35 U.S.C. §119(e) of U.S. provisional application 60/091,676, filed Jul. 2, 1998.

FIELD OF THE INVENTION

The present invention relates generally to articles that display periodic ordering, and more particularly to polymeric articles and methods for producing periodic porous and relief articles therefrom.

BACKGROUND OF THE INVENTION

Polymeric materials that form an inorganic oxide ceramic upon oxidation, for example by chemical oxidation or by oxygen plasmas, have seen wide application, for example in photoresists for integrated circuit production and as oxygen reactive ion etch barriers. A number of investigators have studied the use of silicon-containing homopolymers as etch resistant layers for such applications (see for example Chou N. J., Tang C. H., Paraszcazk J., Babich E. "Mechanism of Oxygen Plasma Etching of Polydimethylsiloxane Films," *Applied Physics Letters*, 46: p. 31 (1985); and Gokan H., Saotome Y., Saigo K., Watanabe F., Ohnishi Y. "Oxygen ion Etching Resistance of Organosilicon Polymers," In *ACS Symposium Series: Polymers for High Technology Electronics and Photonics*. in Anaheim, Calif., Turner S. R., Bowden M. J. eds., American Chemical Society, Washington, D.C. (1986)). Such materials that contain at least about 10% wt silicon based on the total weight of the polymer are known to form a thin layer of etch resistant $SiO_x$ ceramic when exposed to an oxygen plasma. This oxide layer is responsible for their low etch rate relative to polymers containing only C, H, N, and O atoms. This etch selectivity provides the basis for photoresist schemes involving pattern transfer.

One-, two-, and three dimensional periodicity in block-copolymeric, self-assembled structures is also known (Thomas, et al., "Phase Morphology in Block Copolymer Systems", *Phil. Trans. R. Soc. Lond. A.,* 348: pp. 149-166). Lamellar, cylindrical, spherical, and ordered bicontinuous double diamond morphologies in block copolymeric systems have been identified (see, for example, Helfand, et al., *Developments in Block Copolymers.* 1; Goodman, I., Ed.; Applied Science Publishers: London, 1982: vol. 1, pp. 99-126; Herman, et al., *Macromolecules*, 20, 2940-2942, (1987).

A number of studies on the synthesis of block copolymers including blocks comprising silicon-containing polymer sequences have been reported. In some cases, the block copolymers have been studied for use in photoresists in image transfer processes.

Hartney et al. (a), ("Block Copolymers as Bilevel Resists", *SPIE*. 539: p. 90 (1985)) describe siloxane-based copolymers used for bilevel photoresists in image transfer processes. Hartney describes lamellar, spherical, and cylindrical phase-separated morphologies. However, the glass transition temperatures of the siloxane blocks are low (below about 0 degrees C.) allowing the low surface energy siloxane blocks to migrate to the interface of the block copolymer with the air modifying the surface properties of the block copolymer. This migration tends to form a continuous layer of a siloxane polymeric species at the surface which is subsequently exposed to oxygen reactive ion etching. This provides a surface with a high degree of etch resistance (due to $SiO_x$ formation) but limits the range of obtainable etched structures. Furthermore, the low glass transition temperature of the siloxane block results in poor dimensional stability of the block copolymer.

Gabor et al. ("Synthesis and Lithographic Characterization of Block Copolymer Resists Consisting of Both Poly(styrene) Blocks and Hydrosiloxane-Modified Poly(diene) Blocks", *Chem. Mater.* 6: pp. 927-934 (1994)) describe formation of block copolymers with silicon-containing blocks obtained via post functionalization of poly(diene) blocks with hydrosilanes. The materials thus obtained are block copolymers having a poly(styrene) block and a hydrosiloxane-modified poly(isoprene), or hydrosiloxane-modified poly(butadiene), block which formed lamellar structures with one-dimensional periodicity. The materials were used as an imageable layer in a bilayer resist system. As with the materials described by Hartney et al. (a), the materials produced by Gabor et al. have a low glass transition temperature for the silicon-containing phase before conversion to silicon oxide resulting, in some cases, in poor dimensional stability.

Hirao et al. ("Polymerization of Monomers Containing Functional Silyl Groups. 12. Anionic Polymerization of Styrene Derivatives Para-Substituted With Pentamethyldisilyl (Si—Si), Heptamethyltrisilyl (Si—Si—Si), and Nonamethyltetrasilyl (Si—Si—Si—Si) Groups", *Macromol. Symp.* 95: pp. 293-301 (1995)) describes the formation of block copolymers from a variety of oligosilyl-substituted styrenes and styrene. However, the average molecular weights of the block copolymers thus formed were relatively low (<30,000), and the morphologies of the resulting structures were not described.

It is also known that polymers can be degraded by chemical oxidation and exposure to ultraviolet (UV) radiation. The degradation of polymers containing unsaturated double bonds in the backbone by ozone, for example, has been well studied (see for example, Razumovskii S. D. et al. "Degradation of Polymers in Reactive Gases", *European Polymer Journal*, 7: pp. 275-285 (1971)).

In addition, Koberstein et al. (U.S. Pat. No. 5,661,092) have recently demonstrated $SiO_x$ can be formed in poly(siloxane) oligomers by using a combination of ozone and short wavelength UV light. Koberstein demonstrated that a thin layer of $SiO_x$ film was formed on the surface of a poly(siloxane) and fatty acid metal soap film after UV-ozone exposure.

Ozonolysis is a known technique to produce porous structures from block copolymers. Lee et al. ("Polymerization of Monomers Containing Functional Silyl Groups. 7. Porous Membranes with controlled Microstructures", *Macromolecules*, 22: pp. 2602-2606 (1989) and 21: pp. 276-278 (1988)) describe the formation of block copolymer structures comprised of self-assembled block copolymers of poly(isoprene) and poly(4-vinylphenyl)dimethyl-2-propoxysilane. Lamellar as well as spherical/cylindrical morphologies were obtained; however, the amount of silicon in the silicon-containing domains of the structure was rather low (<3 atomic % based on the total number of atoms in the silicon-containing domain). The samples were subsequently immersed on a solution of ozone in dichloromethane. The ozonide which was produced upon reaction of the poly(isoprene) with the ozone was then decomposed with trimethyl phosphite in methanol. The result was a porous structure maintaining the periodic structure of the block copolymer structures from which they were formed.

Mansky et al. ("Monolayer Films of Diblock Copolymer Microdomains For Nanolithographic Applications", *J. Mater. Sci.*, 30: pp 1987-1992 (1995); and "Nanolithographic Templates From Diblock Copolymer Thin Films", *Appl. Phys. Lett.*, 68: pp. 2586-2588 (1996)) demonstrated the use of ozonolysis to remove poly(butadiene) (PB) domains from block copolymeric structures formed by self-assembly of polystyrene (PS)-poly(butadiene) (PB) diblock copolymers having periodic structures with cylindrical morphology to form porous structures.

Park et al. (Block Copolymer Lithography: Periodic Arrays of ~$10^{11}$ Holes in 1 Square Centimeter," *Science*, 276: pp. 1401-4 (1997)) discloses a method for producing periodic arrays of holes and dots in a silicon nitride-coated silicon substrate via lithography utilizing a phase-separated PS-PB block copolymer having three-dimensional periodicity characterized by spherical domains of PB in a PS matrix as a masking layer. The phase separated block copolymer was coated onto the wafers and used as a masking layer for lithography. In some examples, before etching, PB domains were removed by ozonolysis from the block copolymer structure comprising the masking layer. The resulting etched articles displayed a periodic structure that was not substantially similar to the three-dimensional periodic structure of the block copolymer mask, but rather was a two-dimensional cylindrical periodic structure resulting from the shadow cast onto the substrate by the etch resistant domains of the block copolymer mask during the etching process.

Recently, Hashimoto et al. ("Nanoprocessing Based on Bicontinuous Microdomains of Block Copolymers Nanochannels Coated with Metals". *Langmuir*, 13: pp. 6869-6872 (1997)) reported the removal by ozonolysis of a diene block from a poly(styrene)-poly(isoprene) block copolymer which forms a Ia3d double gyroid structure, thereby forming porous channels in a polystyrene matrix. They subsequently electroplated the surfaces of the channels to form catalytic membrane reactors for chemical synthesis.

The preceding and other techniques represent, in some cases, significant advances in the areas of lithography and self-assembled polymeric structures. However, there is a need in the art for stable, durable, and multi functional periodic structures capable of forming nanostructured and microstructured porous and relief articles; it is an object of the present invention to provide such structures and articles, and further to provide methods for their fabrication.

SUMMARY OF THE INVENTION

The present invention provides a series of systems, articles, and methods associated with, or produced using, periodically structured, microphase separated polymeric articles. The systems and articles include periodically structured microphase separated polymeric materials, and other materials, systems and articles produced from them or produced using them according to the methods provided by the invention. The invention also provides methods for forming the periodically structured microphase separated polymeric materials provided by the invention as well as methods for modifying and using such polymeric materials.

In one aspect, the invention provides a series of systems. One system includes a polymeric article including a three-dimensionally periodic structure of a plurality of periodically occurring separate domains. The structure includes at least a first and a second domain, each being topologically continuous. In addition, the first domain includes a polymeric species containing an inorganic species capable of forming a ceramic oxide. The inorganic species is present in an amount of at least about 3 atomic % based on the total number of atoms in the first domain.

Another system includes a polymeric article including a periodic structure of a plurality of periodically occurring separate domains. The structure includes at least a first and a second domain. The first domain includes a polymerized monomer, the monomer containing an inorganic species capable of forming a ceramic oxide. The inorganic species is present in an amount of at least 3 atomic % based on the total number of atoms in the first domain. The second domain comprises a polymeric species not containing a sufficient quantity of an inorganic species to be capable of forming a ceramic oxide. The polymerized monomer containing an inorganic species capable of forming a ceramic oxide has a glass transition temperature of at least 0 degrees C. Also, the polymers comprising the polymeric article have an average molecular weight of at least 30.000 Da.

Yet another system includes an article including a periodic structure of a plurality of periodically occurring separate domains having a plurality of boundaries between them defining a plurality of interfaces. The structure has at least a first and a second domain separated by a boundary defining an interface. The first domain includes an oxidized polymeric species forming an inorganic oxide ceramic. The second domain is at least partially comprised of void space. The interface between the domains is at least partially comprised of an inorganic oxide ceramic forming a layer at least a portion of the interface that is at least 1 nm thick.

Another systems includes a block copolymeric species having at least two blocks A and B. The blocks A and B are incompatible with each other such that the block copolymeric species is self-assembleable into a three-dimensionally periodic structure of a plurality of separate domains. The structure includes at least a first and a second domain, each being topologically continuous and defined by association of similar blocks of the copolymeric species. At least block A comprises a polymeric species containing an inorganic species capable of forming a ceramic oxide. The inorganic species is present in an amount of at least about 3 atomic % based on the total number of atoms in block A.

Yet another system includes a block copolymeric species having at least two blocks A and B. The blocks A and B are incompatible with each other such that the block copolymeric species is self-assembleable into a periodic structure of a plurality of separate domains. The structure includes at least a first and a second domain, each defined by association of similar blocks of the copolymeric species. At least one of the blocks comprises a polymerized species containing an inorganic species capable of forming a ceramic oxide. The polymeric species containing an inorganic species capable of forming the ceramic oxide is formed of a polymerized monomer containing an inorganic species capable of forming a ceramic oxide. At least one other block comprises a polymeric species not containing a sufficient quantity of inorganic species to be capable of forming a ceramic oxide. The polymerized monomer has a content of the inorganic species of at least about 3 atomic % based on the total number of atoms in the polymerized monomer. Also, the block copolymeric species has a glass transition temperature of at least about 0 degrees C., and an average molecular weight of at least about 30,000 Da.

In another aspect, the invention provides a series of articles and materials. One article includes a periodic structure of a plurality of periodically occurring separate domains, including at least a first and a second domain. The first and second domains have a structure that is defined by self-assembly of at least one polymeric species, and at least one of the domains comprises a molded structure formed of a liquid or solid material that cannot be formed into a periodic structure by self-assembly. Each domain that is not formed of the liquid or solid material is essentially free of the material.

In another embodiment, the invention provides a photonic band gap article including a periodic structure of a plurality of periodically occurring separate domains, with at least a first a second domain. At least the first domain includes an oxidized polymeric species forming an inorganic oxide ceramic, the structure includes at least one interface that is defined by a surface of contact between the first domain and the second domain. The interface is at least partially comprised of a layer of the inorganic oxide ceramic at least 1 nm thick. The structure inhibits the propagation of electromagnetic radiation of at least one wavelength within the range of about 20 nm to 1 µm.

In yet another embodiment, the invention provides a low dielectric constant material including a periodic structure of a plurality of periodically occurring separate domains, with at least a first and a second domain. At least one domain is at least partially comprised of void space, and at least one other domain is at least partially comprised of an inorganic oxide ceramic. The structure has a dielectric constant less than about 3.

In yet another embodiment, the invention provides a high dielectric constant material including a periodic molded structure of a plurality of periodically occurring separate domains, with at least a first and a second domain. The structure has a dielectric constant greater than about 3.

In another embodiment, the invention provides a magnetic article including a three-dimensionally periodic structure of a plurality of periodically occurring separate domains, with at least a first and a second domain. At least one domain has a characteristic dimension not greater than 1 µm and includes a magnetic material. Each domain that includes the magnetic material is non-interconnected.

Another magnetic article includes a periodic structure of a plurality of periodically occurring separate domains, with at least a first and a second domain. The first and the second domains have a structure that is defined by self-assembly of at least one polymeric species. At least one domain includes a magnetic material, and each domain that includes a magnetic material is non-interconnected.

In another aspect, the invention provides a membrane including a periodic structure having a plurality of periodically occurring void spaces defining a plurality of pores. The membrane has at least a first side and a second side. At least one of the pores provides a continuous pathway for fluid communication between the first side and the second side of the membrane, where the pore also has a surface that is at least partially comprised of an oxidized polymeric species forming an inorganic oxide ceramic.

In another aspect, the invention provides a mold including a periodic structure having a plurality of periodically occurring void spaces therein. At least one of the void spaces provides a continuous pathway for fluid communication with the atmosphere surrounding the structure. At least one void space that provides a continuous pathway for fluid communication with the atmosphere surrounding the structure has a surface at least partially comprised of an oxidized polymeric species forming an inorganic oxide ceramic. The inorganic oxide ceramic forms a layer at least 1 nm thick at least a portion of the surface of the void space.

In another aspect, the invention provides a series of methods for making and using the inventive systems and articles provided by the invention. One method involves processing a block copolymeric species that includes at least one block comprising a polymeric species containing an inorganic species capable of forming a ceramic oxide. The inorganic species is present in an amount of at least about 3 atomic % based on the total number of atoms in the block including the polymeric species containing the inorganic species. The processing step involves producing a phase separated, multi-domain, three-dimensionally periodic polymeric article that includes a structure of a plurality of separate domains, with at least a first and a second domain, each being topologically continuous and each being defined by a association of similar blocks of the copolymeric species.

Another method involves processing a block copolymeric species that includes at least one block comprising a polymeric species containing an inorganic species capable of forming a ceramic oxide. The polymeric species containing an inorganic species capable of forming a ceramic oxide is formed of a polymerized monomer that contains an inorganic species capable of forming a ceramic oxide. The block copolymeric species includes at least one other block comprising a polymeric species not containing a sufficient quantity of inorganic species to be capable of forming a ceramic oxide. The polymerized monomer has a content of the inorganic species of at least about 3 atomic % based on the total number of atoms in the polymerized monomer, and, furthermore, the polymerized monomer has a glass transition temperature of at least 0 degrees C. The block copolymeric species has an average molecular weight of at least about 30,000 Da. The processing step involves producing a phase separated, multi-domain, periodic polymeric article that includes a structure of a plurality of separate domains, with at least a first and a second domain, each being defined by association of similar blocks of the copolymeric species.

Another method involves creating a periodic structure of a material by providing a mold comprising a periodic structure including a plurality of periodically occurring void spaces. The mold includes at least one void space that has a surface at least partially comprised of an oxidized polymeric species forming an inorganic oxide ceramic. The inorganic oxide ceramic forms a layer at least 1 nm thick. The method further involves at least partially filling the void space with the material.

Yet another method involves forming a polymeric article that includes a periodic structure of a plurality of periodically occurring separate domains, with at least a first and a second domain. The first domain comprises a polymeric species containing an inorganic species capable of forming a ceramic oxide. The inorganic species is present in an amount of at least about 3 atomic % based on the total number of atoms in the first domain. The method further comprises at least partially removing at least one domain from the structure and at least partially oxidizing the structure to form an inorganic oxide ceramic.

The invention also provides a method for forming a conducting network. The method includes providing a polymeric article including a periodic structure of a plurality of periodically occurring separate domains, with at least a first and a second domain. The method further includes at least partially removing at least one domain to form at least one void space and at least partially filling the void space with a conducting material to form at least one conducting pathway.

Another method involves at least partially oxidizing a polymeric article. The article includes a periodic structure of a plurality of periodically occurring separate domains, with at least a first and a second domain. The first domain comprises a polymeric species containing an inorganic species capable of forming a ceramic oxide. The inorganic species is present in an amount of at least about 3 atomic % based on the total number of atoms in the first domain. Furthermore, at least one domain of the structure has been at least partially removed. The at least partially oxidizing step of the method forms an inorganic oxide ceramic.

In another aspect, the invention provides methods for forming a magnetic article. One method for forming a magnetic article includes forming a polymeric article having a periodic structure of a plurality of periodically occurring separate domains, with at least a first and a second domain, at least partially removing at least one domain to form at least one void space, and adding a magnetic material to the void space so as to at least partially fill the void space with the magnetic material.

Another method for forming a magnetic article includes forming on a substrate a polymeric article having a periodic structure of a plurality of periodically occurring separate domains, with at least a first and a second domain, at least partially removing at least one domain to form at least one void space, and adding a magnetic material to the void space.

Other advantages, novel features, and objects of the invention will become apparent from the following detailed description of the invention when considered in conjunction with the accompanying drawings, which are schematic and which are not intended to be drawn to scale. In the figures, each identical or nearly identical component that is illustrated in various figures is represented by a single numeral. For purposes of clarity, not every component is labeled in every figure.

BRIEF DESCRIPTION OF THE DRAWINGS

FIG. 15a is a photocopy of a computer simulated bright field TEM image of a thin section of a three-dimensionally periodic polymeric article produced according to one embodiment of the invention;

FIG. 15b is a photocopy of a bright field TEM image of a thin section of a three-dimensionally periodic polymeric article produced according to one embodiment of the invention;

FIG. 15c is a photocopy of a bright field TEM image of an thin section of a three-dimensionally periodic polymeric porous article produced according to one embodiment of the invention;

DETAILED DESCRIPTION OF THE INVENTION

Figure 1:
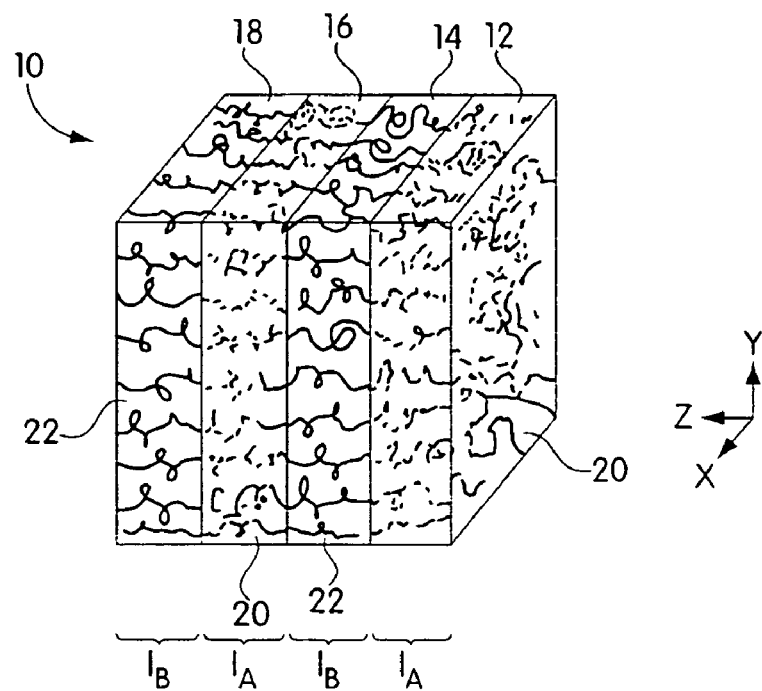
FIG. 1 is a schematic illustration of a one-dimensionally periodic polymeric article.

The present invention provides unique polymeric articles which can be made, by the methods provided by the invention, into porous and relief nanostructures and, in some embodiments, unique ceramic articles with nanostructures unattainable by other methods. The term "polymeric system" or "polymeric article" as used herein includes any system or article constructed at least in part from at least one polymer material. The polymeric systems of the invention can be inexpensive, can be mechanically flexible, dimensionally stable, and, in certain embodiments, can self-assemble. The polymeric articles of the invention can exhibit one-, two-, and three-dimensionally periodic structures (or, equivalently, structures with one-, two-, or three-dimensional periodicity) arranged into separate domains within the structure with different domains characterized by a different chemical composition and/or set of physical properties.

A periodic structure in a general sense is a structure arranged so that a straight line in at least one direction which passes through the structure will intersect at regular intervals at least two separate domains. A "one-dimensionally" periodic structure refers to a structure which can be oriented in the three dimensional coordinate system (with mutually orthogonal X, Y, and Z component directions) so that a straight line in only one component direction will pass through the structure and intersect at regular intervals at least two separate domains. A "two-dimensionally" periodic structure refers to a structure which can be oriented in the three dimensional coordinate system so that straight lines in only two component directions will passes through the structure and intersect at regular intervals at least two separate domains. And finally, a "three-dimensionally" periodic structure refers to a structure which can be oriented in the three dimensional coordinate system so that straight lines in all three component directions may pass through the structure and intersect at regular intervals at least two separate domains. Furthermore, the term "periodic structure" as used herein refers to those articles with domain structures having regular periodicity as characterized by like domains having similar characteristic dimensions and spacing within the article.

Preferred articles according to the invention have at least one domain that is selectively removable from the structure to form a porous or relief structure. Furthermore, according to one aspect of the invention, at least one domain contains an inorganic oxide ceramic, or is comprised of a polymeric species which forms an inorganic oxide ceramic upon oxidation. For embodiments having at least one domain containing an inorganic oxide ceramic, or comprised of a polymeric species which forms an inorganic oxide ceramic upon oxidation, at least one other domain within the structure can be comprised of a polymeric species which can be degraded and subsequently removed from the structure to form a porous or relief structure; in some embodiments, such porous or relief structures are at least partially comprised of an inorganic oxide ceramic forming a ceramic nanostructure. The invention also provides a variety of novel articles based on porous and relief nanostructures, including ceramic nanostructures, such as membranes, molds (and novel materials formed with such molds), photonic band gap articles, etc.

In one aspect, the present invention involves a polymeric article which makes use of polymeric materials (or, equivalently "polymers"). The materials can include, but are not limited to, homopolymers, blends of homopolymer, copolymers including random, graft and block copolymers, blends of copolymers, blends of homopolymers and copolymers, and any such systems mixed with additives such as dyes, particles, inorganic atoms and the like. In certain embodiments, the systems of the present invention comprise polymeric materials, or mixtures of polymeric materials, or mixtures of polymeric materials and other, non-polymeric materials, and include two or more distinct domains of different composition and/or physical, chemical, or dielectric properties. In some embodiments, one or more of the distinct domains of the systems can comprise non-polymeric material or void space.

The term "domain." as used herein, defines a distinct region of the system characterized by a particular chemical composition and/or set of physical properties that differs from that of surrounding or adjacent domains. These distinct domains can be comprised of species, including in some embodiments one or more polymeric species, hereinafter referred to as "polymeric blocks." The domains can be based on distinct polymeric blocks that can be comprised of a variety of components. The polymeric blocks typically are defined by phase-segregated, immiscible polymeric species such as immiscible mixtures of homopolymer species or random copolymer species, or chain regions (blocks) of a block copolymer that are comprised of immiscible monomer sequences, or mixtures of the above with or without other non-polymeric additives. Systems comprising multiple polymeric blocks can be comprised of one or more block copolymers or polymeric mixtures involving various blends of homopolymers and/or random copolymers with block copolymers, for example: a homopolymer or random copolymer comprising a polymeric species A with a block copolymer comprising blocks A'+B, where A and A' are miscible and are incompatible with B such that the homopolymer or random copolymer A forms a polymeric block in combination with block A' of the block copolymer, and block B of the block copolymer forms a distinct polymeric block; or a homopolymer or random copolymer comprising a polymeric species A, a block copolymer comprising blocks A'+B, and another homopolymer or random copolymer defining a polymeric species B', where A and A' together are miscible and form a polymeric block and B and B' are together are miscible and form a polymeric block. It is to be understood that the preceding examples are only exemplary, and that those skilled in the art would readily conceive of additional examples which are within the scope of the invention. In one preferred embodiment, the present invention makes use of self-assembling polymeric systems, for example block-copolymeric systems and blends of various polymers that can include block-copolymers to form one, two, and three-dimensional structures that can, in certain embodiments, be topologically continuous. As used herein. "topologically continuous" means continuous, in the sense that a particular domain in a periodic, polymeric structure forms a continuous pathway through the structure. In other embodiments, the structures can include one or more domains that are not topologically continuous, for example three-dimensionally periodic structures with spherical domain morphology. In some embodiments like domains in a periodic structure may be interconnected. "Interconnected," as used herein refers to a domain that is physically continuous or in physical contact with at least one other like domain. In some such embodiments, a continuous chain of such continuous like domains forms a continuous pathway through the structure. In other embodiments, one or more like domains of the structure are "non-interconnected," meaning that such domains are physically isolated to from, and not in physical contact with, other like domains in the structure.

Preferred polymeric articles will have at least one domain of the structure formed of a polymeric block comprised of a polymeric species that is selectively degradable and removable from the structure. In some such embodiments, at least one other domain contains an inorganic species capable of forming a ceramic oxide. A "polymeric species that is selectively degradable and removable" as used herein refers to a homopolymer or block of a block copolymer that has a chemical structure allowing the species to be chemically degraded into monomers or oligomer chains with a molecular weight less than that of the non-degraded polymer, such that the species can be degraded and removed without substantially altering the periodic structure and morphology of the remaining domains. Such species are well known in the polymer and lithography arts and include species that can be selectively degraded by means such as oxidation (for example, species containing unsaturated bonds in their backbone, for example poly(isoprene), poly(butadiene), other poly(dienes), etc), exposure to radiation (for example, traditional photoresist polymers such as poly(dienes), poly(acrylates), etc.) or exposure to appropriate solvents, heat, electron beams, bases, etc. Examples of known materials that are degradable by treatment with bases include, but are not limited to poly(glycolic acid), poly(caprolactone), poly(lactic acid), etc. Polymeric species comprising the domains which are not degraded or removed from the structure preferably comprise polymeric species which are resistant to the treatment applied to the structure to degrade and remove the polymeric species that is selectively degradable and removable. Such species can, in some embodiments, include known oxidation and/or radiation resistant materials including, but not limited to poly (styrene), poly(ethylene) and polymers containing inorganic species such as poly(silanes), poly(siloxanes), etc. (e.g. see Hartney et al. (a): and Lee et al., both previously cited).

In some preferred embodiments according to the invention, polymeric species comprising the domains which are not degraded or removed from the structure include a polymeric species containing an inorganic species capable of forming a ceramic oxide. A "polymeric species containing an inorganic species capable of forming a ceramic oxide" as used herein refers to a homopolymer or block of a block copolymer that has an inorganic species as part of its structure which forms an inorganic oxide ceramic upon oxidation. Examples of such polymeric species are those that contain inorganic species such as Si, Ge, Sn, B, Ti, Fe, or Al atoms, such polymeric species being well known in the art (see for example, Chan et al. "Synthesis and Characterization of Boron Nitride Thin Films Prepared by a Polymer Precursor Route," *J. of Mater. Res.,* 11: pp. 373-380 (1996); and Foucher et al., *J Am Chem Soc,* 114: p. 6246 (1992)).

In some embodiments, the polymeric species containing an inorganic species capable of forming a ceramic oxide will constitute the majority component (>about 50% wt based on the total weight of the domain) of the domain; however, in other embodiments, the inorganic species may be present in a polymeric or non-polymeric additive to the domain or component that comprises less than about 50% wt of the domain. In preferred embodiments, the inorganic species capable of forming a ceramic oxide is present in the domain in an amount sufficient to form an inorganic oxide ceramic upon oxidation (as discussed below). Typically, an inorganic species present in an amount of at least about 3 atomic % based on the total number of atoms in the domain is sufficient. The term "atomic %" as used herein refers to the number of selected atoms in a sample divided by the total number of atoms present in the sample multiplied by 100%.

In preferred embodiments, the polymeric species containing an inorganic species capable of forming a ceramic oxide is formed by polymerization of monomers which contain the inorganic species as part of their covalent structure. Alternatively, a polymeric species which does not contain an inorganic species capable of forming a ceramic oxide but which is reactive with a species that does contain such an inorganic species may be used. In such cases, the polymeric species can be subjected to a post-polymerization functionalization with the inorganic species-containing moiety (for examples and methods see Gabor et al. herein incorporated by reference).

In some preferred embodiments, the polymeric species containing an inorganic species capable of forming a ceramic oxide is a silicon-containing polymeric species. Silicon-containing polymers are well known photoresist materials that are inexpensive and readily available. Silicon-containing polymers can form $SiO_x$ (e.g. $SiO_2$) ceramic oxides upon oxidation, for example with an oxygen plasma (see Hartney et al. (a) previously cited; Hartney, et al. (b) "Silicon Oxidation During Bilayer Resist Etching", *SPIE,* 1086: p. 150 (1989); Hartney, et al. (c) "Critical Review: Oxygen Plasma Etching for Resist Stripping and Multilayer Lithography", *J. Vac. Sci. Tech.,* 7: pp. 1-13 (1989)). Any silicon-containing polymeric species can be potentially useful for the invention such potentially suitable polymeric species are well known in the art and include those disclosed, for example in Hartney et al. (a), (b), and (c), Lee et al., Chou et al., Gokan et al., each previously cited, and Chu et al. "Morphologies of Strongly Segregated Polystyrene-Poly(dimethylsiloxane) Diblock Copolymers," Polymer, 36: pp. 1569-75 (1995). A preferred silicon-containing polymeric species for use in certain embodiments of the invention is poly(p-pentamethyldisilylstyrene) P(PMDSS).

The polymeric articles that include at least one domain including a polymeric species containing an inorganic species capable of forming a ceramic oxide according to the invention also, preferably, include at least one domain formed of a polymeric block comprised of a hydrocarbon polymeric species not containing a sufficient quantity of inorganic species to be capable of forming a ceramic oxide, such that the domain is free of such inorganic species to the extent that an inorganic oxide ceramic does not form within the domain upon oxidation. In even more preferred embodiments, the polymeric species comprising the domains that are essentially free of the inorganic species comprise degradable and removable polymeric species, as described above, that possess unsaturated bonds in their backbones such that the polymeric species can be degraded by oxidation by ozone or other suitable chemical oxidizers, are of a resist material, such as, for example, poly(methyl methacrylate) (PMMA) such that the polymeric species is degradable by traditional lithography routes (e.g. exposure to ultraviolet (UV) light or electrons), or can be selectively degraded by other known means, such as heat, exposure to solvents, exposure to bases, etc.

In general, a vast array of different block copolymers, combinations of different homopolymeric species, or combinations of block copolymers, random copolymers, graft copolymers, and homopolymeric species can be used in accordance with the invention so long as other criteria described herein are met. Polymers and block copolymers can include a wide variety of side chains that exist naturally, and/or that exist to alter physical properties of the microphase separated articles, such as the characteristic domain size. For embodiments where structures are self-assembled, each of the first and second polymeric blocks can be a mixture of components so long as the polymeric phases separate into the ordered structure desired.

FIGS. 1-5 are schematic illustrations that are representative of self-assembled, periodic polymeric structures with topologically continuous domains according to the invention. In the following discussion of length scales and periodicity, for the sake of simplicity, reference will be made primarily to structures comprised of two separate domains (A and B) a plurality of which can be present in the structure that recur with simple one dimensional periodicity. It is to be understood, however, that the invention encompasses systems with greater than two separate domains, and with two- or three-dimensional periodicity. In such systems, as would be understood by those of ordinary skill in the art, the determination of effective domain and periodicity length scales becomes more complex and is affected by factors such as molecular weight, geometric configuration, desired relative refractive contrast, and others. Incorporated herein by reference Allport, D. C. "Block Copolymers", Elsevier Science, Inc., New York, N.Y., (1991); Thomas, et al., "Phase Morphology in Block Copolymer Systems", *Phil. Trans. R. Soc. Lond. A.,* 348: pp 149-166; Avgeropoulos, et al., "Tricontinuous Double Gyroid Cubic Phase in Triblock Copolymers of the ABA Type", *Macromolecules,* 30: pp. 5634-5642 (1997) describes several such systems.

Referring now to FIG. 1, a one-dimensionally periodic polymeric article 10 is illustrated schematically. Article 10 is made of a series of essentially planar layers 12, 14, 16, and 18 stacked in the X-Y plane, layers 12 and 16 comprising non-interconnected domains and being defined by a first polymeric species 20 and layers 14 and 18 being domains defined by a second polymeric species 22. At least one of these polymeric species can include one or more auxiliary components such as domain dimension modifiers, domain volume fraction modifiers, supplemental sources of inorganic oxide ceramics, processing aids, and/or refractive index/dielectric constant modifying species. The auxiliary components can be comprised of a variety of materials which tend to segregate preferentially in only one or a subset of domains, such as homopolymeric species or particulates. Polymeric species 20 and 22 preferably differ in chemical composition such that one species is selectively degradable and removable. In some embodiments, the species differ such that one species comprises a polymeric species containing an inorganic species capable of forming a ceramic oxide while the other polymeric species comprises a polymeric species that does not contain such an inorganic species. Thus, article 10 includes a periodic structure of alternating first domains 12 and 16 and second domains 14 and 18 that are dissimilar, and differ in chemical composition and/or physical properties. Each of layers 12 and 16 has a domain characteristic dimension $1_A$ and each of layers 14 and 18 has a domain characteristic dimension $1_B$, where the domain characteristic dimensions are approximately equal to the end to end root mean square (RMS) length of each layer, or copolymer block, in the phase separated state, such that the periodicity, or periodic length, L of the structure can be represented, for this simple one-dimensional case, as $L=1_A+1_B$. For more complicated configurations, the periodic length L is proportional, but not necessarily equal to the sum of the characteristic domain dimensions. The particular domain dimension desired will depend upon the ultimate use of the periodic structure. For most applications involving the articles provided by the invention, the characteristic domain dimension will typically be between 1 nm and 1 μm, more typically between 20 nm and 1 μm. The term "characteristic domain dimension" as used herein, refers to the minimum cross-sectional dimension of a domain, where such measurement is made between two points located on an interface defining a phase boundary between separate, dissimilar domains along a direction parallel to a direction of periodicity of the article; for example in FIG. 1, in the positive Z direction.

Figure 2:
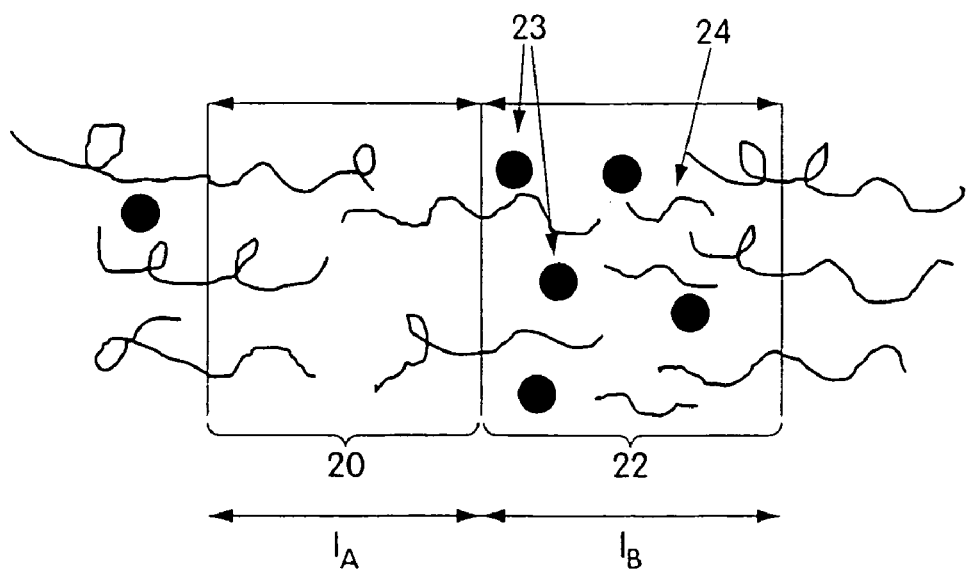
FIG. 2 is a schematic illustration of a one-dimensionally periodic polymeric article including auxiliary modifying species.

FIG. 2 shows an embodiment of a one-dimensional structure having polymeric blocks 20 and 22 which include blocks A and blocks B, respectively, of a diblock copolymer. Polymeric block 22 of the embodiment shown in FIG. 2 is comprised of a mixture of block B of the copolymer, particles 23, and a homopolymer 24.

Figure 3:
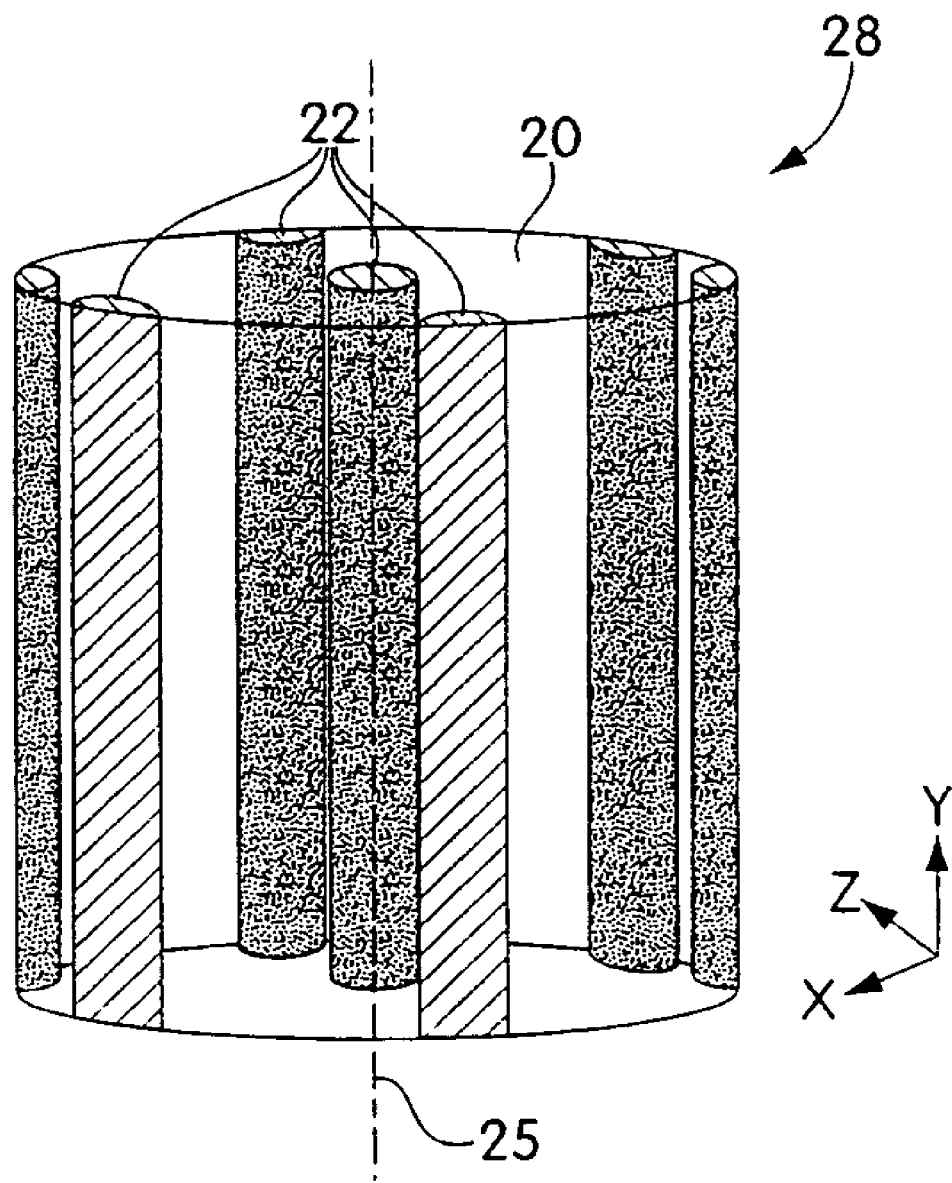
FIG. 3 is a schematic illustration of a two-dimensionally periodic polymeric article.

Referring now to FIG. 3, one possible configuration of a two-dimensionally periodic polymeric article 28 is illustrated. Article 28 includes periodicity in both the X direction and Z direction, but not in the Y direction. The article is made up of a plurality of non-interconnected domains comprising pillars, or columns, arranged having a longitudinal axis 25 (defined as an axis that is co-linear with the axial centerline of the domain and parallel a direction along which the domain is topologically continuous throughout the structure) parallel to the Y axis. Article 28 is defined by a plurality of cylindrical polymeric domains of polymeric species 22 with their longitudinal axes 25 extending in the Y axis of the structure, separated by domains of polymeric species 20. In this case, the periodic length is proportional to the minimum distance between adjacent columns.

Figure 4:
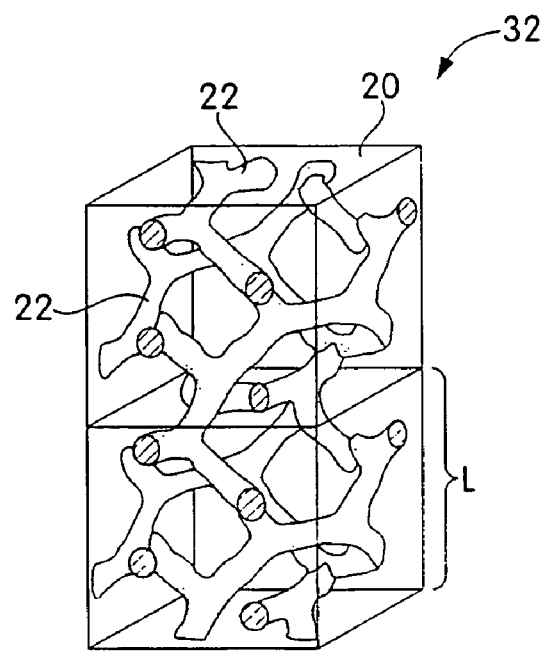
FIG. 4 is a schematic illustration of a three-dimensionally periodic polymeric article.

Referring to FIG. 4, a three-dimensionally periodic polymeric article 32 is illustrated which is periodic in terms of polymeric species 20 and 22 in each of the X, Y, and Z directions at a periodic length L. The structure of FIG. 4 is a double gyroid arrangement of polymeric species 22 surrounded by polymeric species 20 in which the domains comprised of each species are interconnected.

Figure 5:
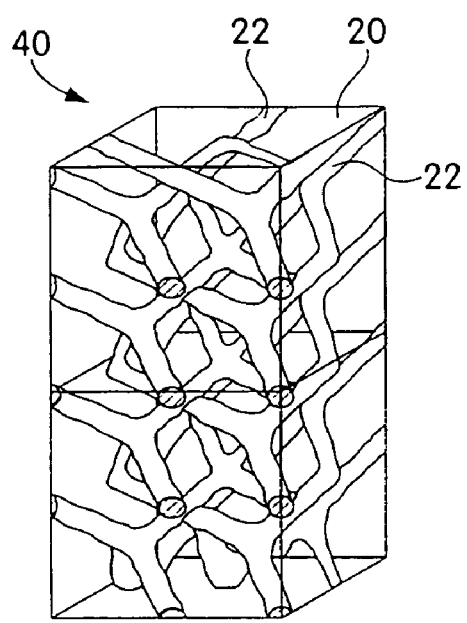
FIG. 5 is a schematic illustration of another three-dimensionally periodic polymeric article.

FIG. 5 illustrates a polymeric, three-dimensionally periodic article 40 including an arrangement of polymeric species 22, in double diamond configuration, surrounded by polymeric species 20. As above in FIG. 4, each of the domains in FIG. 5 is interconnected.

Polymeric species 20 and 22 can be arranged periodically, as illustrated in FIGS. 1-5, in a variety of ways. According to one technique, the polymeric species comprising domains 20 and 22 comprise different blocks of a block copolymer. The block copolymer includes blocks of the polymeric species comprising domain 20 alternating with blocks of the polymeric species comprising domain 22, the copolymer self-assembled into a periodically ordered, structured array. Either of the species (association of blocks) 20 and 22 can also include one or more compatible auxiliary species. Auxiliary species may be desirable to control characteristic domain dimensions, domain volume fraction, or other physical or chemical properties. In other embodiments, a copolymer can be used that includes more than two phase separable blocks, for example a triblock tercopolymer.

The polymeric species used for both domains 20 and 22, are preferably below their melt temperature (Tm) and preferably below their glass transition temperature (Tg) at service temperatures. For embodiments involving at least one domain including a polymeric species containing an inorganic species capable of forming a ceramic oxide, in order to yield articles with sufficient dimensional and temporal stability of the domains comprised of the polymeric species containing an inorganic species capable of forming a ceramic oxide (e.g. silicon-containing polymeric species), it is preferred that the polymeric species (e.g. copolymer block) containing an inorganic species capable of forming a ceramic oxide comprising such domains have a glass transition temperature of at least about 0 degrees C. For embodiments involving self-assembled polymeric articles, the articles are formed by a mixture of polymeric species or block copolymer chains each including at least one first polymeric block of species 20 and at least one second polymeric block of species 22 immiscible with the first block. The polymeric species are selected such that, at a temperature above melt temperature or in solution in a suitable solvent, they are segmentally mixed and upon, for example, solidification from a melt or evaporation of a solvent from a solution, the ordered structure is formed including a continuous matrix of amorphous domains. For embodiments involving block copolymers, the amorphous domains are typically defined by selective association of the first blocks and second blocks of the copolymer, respectively.

For embodiments where the systems are self-assembled, species for forming a polymeric mixture or block copolymer defining species 20 and 22 as exemplified can be selected according to the following criteria: The polymeric mixture or block copolymer forms separate domains upon phase separation occurring from solidification (including via evaporation from a solvent), or, alternatively, upon annealing at an elevated temperature after solidification; one or both components can be below Tg or Tm. Species used in the polymeric mixture or defining the block copolymer form the ordered structure in a manner such that global dimensional stability of the structure exists. As used herein, "microphase separation" means a process in which polymeric blocks are locally segregated to form ordered domains.

That is, a polymeric mixture or block copolymer that defines both species 20 and 22, according to embodiments involving self-assembled articles, is an association of polymer or block copolymer chains in which inter-chain/block, non-covalent chemical attraction such as polar/polar or polar/induced polar interactions, including hydrogen bonding, or nonpolar/nonpolar interactions including van der Waals interactions, create association between the chains that promotes domain formation while maintaining a degree of dimensional stability required for a particular application. This non-covalent, chemical attraction of species comprising polymeric blocks to each other results in unique thermodynamic and rheological behavior. At high temperatures, or in solution, the polymeric mixtures or block copolymers form isotropic phases in which the different species comprising the polymeric blocks are randomly or, in the case of block copolymers, segmentally mixed. Upon lowering the temperature or evaporating away the solvent, or upon precipitation from solution, the repulsion between unlike species or segments increases, causing the polymeric mixture or copolymer to phase separate locally into distinct regions (For the case of block copolymers, each region is composed of one of the block components). These segregated regions subsequently organize into ordered periodic structures, the morphology of which, as known to those skilled in the art, is governed by, among other things, the relative volume fractions of the different polymeric blocks, which can depend on the molecular weight of the species comprising the polymeric blocks and presence of auxiliary additives. For further discussion regarding the effects of relative volume fraction on the morphology of ordered periodic polymeric structures, the reader is referred to Thomas, et al., "Phase Morphology in Block Copolymer Systems", *Phil. Trans. R. Soc. Lond. A.,* 348: pp 149-166, herein incorporated by reference. Thus, global dimensional stability is imparted to the material.

The following discussion on miscibility will aid those of ordinary skill in the art in selecting suitable first and second blocks for a copolymer that defines species 20 and 22, or for separate polymers that define these species, or a combination (i.e. a block copolymer that includes one or more auxiliary polymeric species associated with one or more domains). This discussion can be generalized also to a higher order block copolymer, such as a triblock (A-B-C) tercopolymer. For an example of a diblock copolymer of N total segments, with a 50:50 volume composition, $\chi N > 10.5$ for block segregation. The critical value of $\chi N$ is larger if the volume composition is different from 50:50. For asymmetric A-B diblock copolymer compositions, the value of $\chi N$ required for block segregation can be calculated from a well-known formula by L. Leibler (Macromolecules 13, 1602 (1980)), while for A-B-A triblock tercopolymers, a similar formula by A. M. Mayes and M. Olvera de la Cruz (J. Chem. Phys. 91, 7228 (1989)) can be employed to calculate values of $\chi N$ required for phase separation for any composition and molecular weight. Those of ordinary skill in the art can carry out this determination technique, and can determine the critical $\chi N$ for a given diblock or triblock copolymer composition and can also use similar criteria, readily available, for other types of phase-separable polymeric mixtures.

The molecular weight of polymer or copolymer components defining species 20 and 22 should be selected to be high enough so that a segregated morphology in the service temperature range of the polymeric article is maintained. Specifically, the average molecular weight typically is at least as high as the entanglement molecular weight of the polymeric species comprising a polymeric block (e.g. homopolymeric species or blocks of a block copolymer). For many of the polymeric species of interest, the average molecular weight is typically at least about 5,000, more typically at least about 15,000, and most typically at least about 30,000, and for certain embodiments at least 100,000, and for other embodiments at least 500,000. In some embodiments the periodic length L, proportional to the sum of the characteristic domain dimensions $1_A$ and $1_B$ is related to the molecular weight of the species comprising each domain. In some preferred embodiments, in order to provide high stability ordered structures, the polymeric articles are comprised of polymers, for example homopolymers or block copolymers, which have an average molecular weight of at least about 30,000 Da, exclusively, or in addition to lower molecular weight polymers.

Synthetic procedures such as anionic living polymerization (for example, see Hirao et al. previously cited and incorporated by reference; and Hirao, A., and Nakahama, S. "Anionic Living Polymerization of Monomers With Functional Silyl Groups", *Prog. Polym. Sci.,* 17: pp. 283-317 (1992) herein incorporated by reference), Ziegler-Natta polymerization and ring-opening metathesis polymerization (ROMP) (see, for example, Odian, G. "Principles of Polymerization" 2d Ed., Wiley, New York; "Principles and Applications of Organotransition Metal Chemistry", Collman, J. P., Hegedus, L. S., Norton, J. R., and Finke, R. G., University Science Books, Mill Valley, Calif., 1987, p 590; Grubbs, R. H. In *Comprehensive Organometallic Chemistry*; Wilkinson, G.; Stone, F. G. A.; Abel, E. W., Eds.; Pergamon: New York, 1982; Vol. 8, Chapter 54, p 502; Dragutan, V.; Balaban, A. T.; Dimonie, *M. Olefin Metathesis and Ring Opening Polymerization of Cycloolefins*; Wiley, New York, 1986; Dolgoplosk, B. A.; Korshak, Yu. V. *Russian Chem. Rev.,* 1984, 53, 36) are well-suited for the preparation of a block copolymeric species defining species 20 and 22 with well-defined molecular weights and compositions. Anionic living polymerization methods are preferred for the polymerizations involving monomers containing an inorganic species capable of forming a ceramic oxide (e.g. Si-containing monomers) since the technique results in a polymer with a low degree of polydispersity yielding excellent microphase separated structures. In this context, the preferred polydispersity for the synthesized polymers for use in the current invention is not greater than about two. Most preferably, the polydispersity is as close to one as reasonably obtainable. Alternatively, block copolymers can be prepared by the reaction of end-functionalized homopolymers, by addition polymerization of one block component onto an end-functionalized homopolymer, or by sequential addition of two monomer species in a living free radical polymerization.

In some embodiments, a periodically structured polymeric article can be prepared from the polymeric species by processing, such as melt pressing, or solvent casting techniques such as spin coating or slow evaporation. Technologies for synthesizing and processing such polymeric species are well-known to those of ordinary skill in the art, and includes roll casting or shear casting to achieve near single crystal texture (see, for example, Albalak, R. J., Thomas, E. L, "Microphase Separation of Block Copolymer Solutions in a Flow Field", *J. Polym. Sci., Polym. Phys. Ed.,* p 37-46; and Thomas et al. U.S. Pat. No. 5,622,668).

The article can be prepared as either a thin film, having, in some embodiments, a final thickness of about 10 nm to about 1 μm, or as a bulk material, with a final thickness greater than the range above, depending on the desired use. When prepared as a thin film, for example, a solution of the polymer material in an organic solvent, for example toluene, can be prepared with a polymer concentration typically ranging from about 0.1%-30% wt. The thin film article can be prepared, for example, by forming the article on a substrate, for example by spin coating the solution onto the substrate (e.g. silicon wafers, mica, silicon nitride membranes, conductive plates or discs, conductor-coated plates or discs, etc.) or, alternatively, depositing the solution onto a liquid (e.g. water) surface. The solvent is then allowed to evaporate, and subsequently, the film can be annealed in a vacuum oven at a temperature above the Tg of the polymeric block having the highest Tg in the article in order to evaporate residual solvent and to induce microphase separation of the polymeric article to form an ordered structure.

For embodiments where a thin film article is prepared by casting the polymer solution onto a substrate, the morphology and orientation of the domains of the resulting ordered structure can be controlled by employing or modifying a variety of methods known in the art. For example, for some preferred embodiments involving articles with one-dimensionally periodic lamellar structures (see FIG. 1) or two-dimensionally periodic structures with cylindrical domains (see FIG. 3) formed on a substrate, the lamellae or the longitudinal axes of the cylindrical domains will be oriented so that they are non-coplanar, and in some such embodiments essentially perpendicular, to the surface of the substrate that is in contact with the article. Techniques that can be used or modified for providing such orientation include: modification of the surface energy of the surface of the substrate in contact with the article; controlling solvent evaporation rates; controlling film thickness; and employing electric and/or shear fields during the casting process. Such techniques are described in, for example, v.d.B.R. van Dijk M. A., "Ordering phenomena in Thin Block Copolymer Films: Studies Using Atomic Force Microscopy," Macromolecules, 28:6773-8 (1995); Kim G and Libera M, "Morphological Development in Solvent-Cast polystyrene-poly(butadiene)-polystyrene (SBS-triblock copolymer thin films)," Macromolecules, 31:2569 (1998); Rockford L, et al., "Polymers on Nanoperiodic Heterogeneous Surfaces," Physical Review Letters, 82:2602 (1999); Huang E., et al. (a), "Using Surface Active Random Copolymers to Control the Domain Orientation in Diblock Copolymer Thin Films," Macromolecules, 31:7641 (1998); Huang E. et al. (b), "Nanodomain Control in Copolymer Thin Films", Nature, 395: 6704 (1998); Mansky P. et al. (b), "Large-area domain alignment in Block Copolymer Thin Films Using Electric Fields", Macromolecules, 31:4399 (1998); each incorporated herein by reference.

For preparation of polymeric articles to form bulk materials, a low concentration (e.g. about 5% wt.) solution of the polymer material in an organic solvent such as toluene can be prepared and subsequently cast in a casting dish. The solvent is then permitted to slowly evaporate. The resulting article can then be removed and annealed at a temperature higher than the Tg of the polymeric block having the highest Tg in a vacuum oven typically for 1 to 4 weeks in order to induce order into the microphase separated structure. Alternatively, the polymer material can also be roll cast from a more concentrated solution of the polymer material in an organic solvent (e.g. about 30% wt polymer in cumene) and subsequently annealed as previously described in order to induce order into the microphase separated structure.

Characteristic dimensions of the individual domains that make up the periodic structure can be controlled by adjusting the length of one or more polymeric species (e.g. blocks of a phase-separated block copolymer) that defines the structure, adjusting polymer processing conditions that increase or decrease the stacking, coiling, or other arrangement of polymer chains (or copolymer blocks), addition of homopolymers, etc. Polymerization procedures that avoid side reactions and that allow control over molecular weight of particular blocks of block copolymers, or molecular weights of polymeric species are preferred for yielding a desired domain dimension. When constructing high-molecular weight systems, in order to achieve segregation into periodic, microphase-separated domains special processing steps may need to be taken. At higher molecular weights, a polymeric species may become more viscous, thus more time may be required for phase separation to occur. With high-molecular-weight systems, phase segregation can be carried out by dissolving the system in a suitable solvent, removing the solvent slowly and, near the order-disorder transition point, greatly decreasing the rate of solvent removal and optionally adding kinetic energy by vibrating the system via an ultrasonic apparatus, imposing oscillatory or steady shear extrusional flow, exposing the system to a static or dynamic electric or magnetic field (especially where one polymeric species or block has a higher relative susceptibility to the field such as via incorporation of an auxiliary species) or combinations thereof or the like.

The size of separate polymeric domains can be controlled also via changing the volume fraction of the domain, for example by incorporation of auxiliary particles, auxiliary homopolymeric species, auxiliary monomeric or cross-linkable species that are polymerized, grafted, and/or cross-linked in situ, and the like.

For purposes of the invention, a polymeric mixture or block copolymeric species having at least two polymeric blocks each comprised of species having a characteristic RMS chain length in a disordered state of from about 4 nm to about 1 µm is desirable for many applications, or a polymeric mixture or block copolymeric species that self-assembles into a periodic structure having separate domains with characteristic dimensions of, typically from about 1 nm to about 1 µm, and more typically from about 20 nm to 1 µm. The periodic length L is the sum of all the lengths of the distinct domains contained in one period. For a particular embodiment for which a period contains two domains A and B (e.g. see FIG. 1), the periodic length $L=1_A+1_B$, where $1_A$ and $1_B$ are the characteristic dimensions of the A and B domains. In a particular embodiment for which both domains are defined by a pure A/B diblock copolymer with no additives, the periodic length is related to the RMS molecular chain length in the ordered state $L \propto (n_A+n_B)^{2/3} (\bar{x})$ where $n_A$ and $n_B$ are the respective number of monomer units of the separate block copolymer blocks comprising the domains, and $\bar{x}$ is the average length of the monomer repeat unit of the system, where the structure is ordered as a periodic, phase-separated structure. The relationship is $1_A+1_B=(n_A+n_B)^{1/2} (\bar{x})$ when the system is disordered. As previously discussed, for more complex systems, and systems with higher order dimensional periodicity, the relationship between the periodic length and the characteristic domain dimensions is more complex. These relationships can be used to assist selection of species for use in the invention to provide desired characteristic domain dimensions and/or periodic lengths depending on the requirements of the application.

A system can include, in addition to the polymeric species, solvent, preferably non-volatile, in an amount useful in swelling one or both domains, e.g. mineral oil in a poly(butadiene)/styrene copolymer which will swell the poly(butadiene) domain. This can be used to control the size and/or shape of one or more domains. The system can also include other polymeric or non-polymeric additives for modification of domain dimension, other physical or chemical properties, or processibility. In addition, a suitable non-polymeric substance present in the polymeric article can also constitute a separate phase/domain within the periodic structure. A series of screening techniques can be used to select appropriate polymeric species for use in the polymeric, periodically structured articles of the invention which include screening of constituent materials and process screening.

The materials should be screened for the ability to form structures with desired characteristic domain dimensions and, where appropriate, periodic length scales. For embodiments using block copolymers, this can be done by measuring the molecular weight of the block copolymers using low angle laser light scattering (LALLS), size exclusion chromatography (SEC), or Mass Spectrometry (MS).

Planning and simple screening tests can be used to assess the relative compatibility of components including miscibility, phase separation, chemical stability, and processing stability in order to select suitable components for use as polymeric species 20 and 22, whether they be separate species, different blocks of a block copolymeric species, or a combination. A first and second species should be comprised of components that are immiscible at an appropriate molecular weight and composition. The $\chi$ parameter, which is extensively tabulated for a wide range of polymers, can be used to predict miscibility. Once a particular set of species is selected, they can be mixed (if not defined by a block copolymer) and screened for suitability for use in the invention by analysis via differential scanning calorimetry (DSC). If two glass transition temperatures are observed, then the two species (or two blocks of a block copolymer) are immiscible, that is, the desired phase separation has taken place. If only one glass transition temperature is observed, then the components are miscible and phase separation has not occurred, or the glass transition temperatures of the differing species or blocks are coincidentally similar. For the latter situation, if one glass transition temperature is observed, another screening test involving small angle scattering measurements, or Transmission Electron Microscopy (TEM) can determine whether phase separation has occurred. The degree of crystallinity of the polymeric species can be readily determined by thermal analysis techniques such as DSC or Differential Thermal Analysis (DTA).

Another test, Dynamic Mechanical Analysis (DMA), can be used to determine the dimensional stability of phase separated polymeric articles at particular temperatures. The test involves subjecting the polymeric material or block copolymer to heat and determining the resistance to flow. If the material flows easily as a liquid, microphase separation and resulting dimensional stability at the test temperature does not exist.

Processing methods should also be screened for suitability with desired materials. For example, processing temperatures should be below degradation temperatures. Also, the types and magnitude of any physical forces applied during processing should be conducive to successful assembly of periodically ordered systems, and thus should be able to guide one or more assembly/partioning events, which give rise to separate domains and a proper assembly of the domains into the periodic structure. Processing methods should be avoided that lead to the proliferation of undesired imperfections or that induce undesired physical damage to the materials or structure. The formation of a periodic structure possessing suitable characteristic domain dimensions and periodic length and composition can be verified by small angle x-ray measurements (SAXS), transmission electron microscopy (TEM), optical microscopy, and atomic force microscopy (AFM). These methods can also be used to inventory imperfections in the structure.

As mentioned above, a variety of polymeric species, including combinations of polymeric species, can be used to create the periodic polymeric structures of the invention. Where block copolymers are used, they can be linear block copolymers, "comb" copolymers, star copolymers, radial teleblock copolymers, graft copolymers, dendrimers, or a combination. Those of ordinary skill in the art can select suitable polymers or combinations of polymers to create the phase-separated structure of the invention.

Another important aspect of the present invention involves the novel conversion of the periodic polymeric structures previously described into periodic porous and relief articles possessing essentially the same overall periodic structure as the precursor polymeric articles from which they are formed (e.g. the previously described periodic polymeric structures). The novel methods according to the invention involve oxidative removal and/or removal by radiation, heat, bases, solvents, or removal by any other suitable method apparent to those of ordinary skill in the art, of at least part of and in some cases essentially all of a subsection of one or more of the domains present in the precursor polymeric article to form one or more domains at least partially comprised of void space. In some embodiments, the remaining domains in the precursor structure comprised of materials that are resistant to removal by oxidative degradation (e.g. domains comprising a polymeric species, such as copolymer blocks, that contain inorganic species capable of forming a ceramic oxide, or that are otherwise not susceptible to degradation by the means employed to remove polymeric species to form void space) are at least partially converted to an inorganic oxide ceramic via oxidation (e.g. $SiO_x$ for silicon-containing polymers or copolymer blocks) yielding a periodically structured article having at least one domain including an oxidized polymeric species forming an inorganic oxide ceramic (also referred to as a "ceramic article"). An "oxidized polymeric species forming an inorganic oxide ceramic" as used herein refers to the oxidation product, which includes a ceramic oxide, of a polymeric species containing an inorganic species capable of forming a ceramic oxide. As previously discussed, when forming a periodically structured ceramic article, the domains that are removed via oxidation of the polymeric article are those comprised of polymeric species not containing a sufficient quantity of inorganic species to be capable of forming a ceramic oxide upon oxidation. These domains, as previously discussed, are advantageously comprised of polymeric species readily degradable by oxidation (e.g. those with unsaturated bonds in their backbone) and/or radiation (e.g. UV light). "Domains" as applied to porous and relief structures, including ceramic-containing structures, refers to the chemically (e.g. by oxidation and/or radiation) altered corresponding domains of the precursor polymeric structure from which they are derived. The resulting structures produced can have porous or relief morphology, depending on the structure of the precursor polymeric article as explained below. For embodiments of the porous and relief articles including a ceramic oxide, because of the presence of the inorganic oxide ceramic, the articles can possess physical and chemical properties (e.g. temperature resistance, solvent resistance, chemical inertness, etc.) not attainable by typical polymeric articles.

Figure 6:
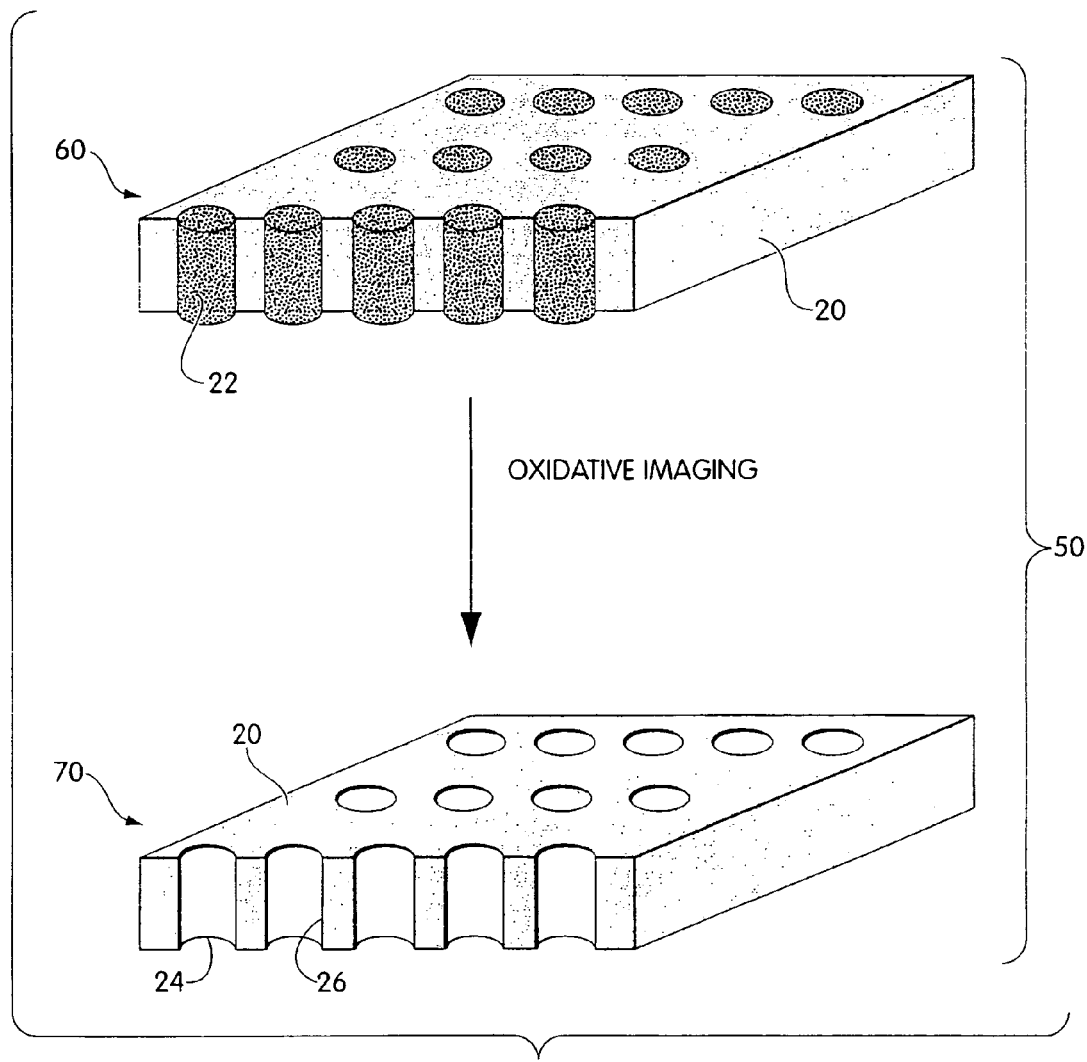
FIG. 6 is a schematic flow diagram showing a method for making a periodically structured porous article.

FIG. 6 shows a process 50 for producing a periodic porous nanostructure 70 according to one embodiment of this aspect of the invention. The inventive method for forming the structures involves first forming a microphase separated periodic polymeric article 60 as previously described. The polymeric article 60 shown in FIG. 6 has a structure with two-dimensional periodicity and with a plurality of cylindrical polymeric domains of polymeric species 22 separated by polymeric species 20. The structure illustrated is similar in arrangement to that previously shown in FIG. 3, but it should be understood that the methods of the invention may be performed with other structural arrangements such as those with one-, two-, or three-dimensional periodicity (e.g. the structures shown in FIGS. 1,3-5). In preferred embodiments, the domains to be at least partially removed by oxidation and/or radiation are topologically continuous. For the embodiment illustrated in FIG. 6, polymeric species 22 comprises a polymeric species susceptible to removal, while polymeric species 20 comprises a polymeric species that is resistant to degradation, for example a polymeric species that contains an inorganic species capable of forming a ceramic oxide.

The second step of the method involves exposing the polymeric article 60 to conditions selected to selectively degrade polymeric species 22, for example to an oxidizing environment and/or radiation at suitable conditions and for sufficient duration to degrade polymeric species 22 so that it may be removed from the structure, for example by soaking the article in a liquid such as deionized water, in order to form a porous structure 70 having domains 24 that comprise void space. For embodiments where polymeric species 24 contains an inorganic species capable of forming a ceramic oxide, in a third step, the resulting article 70 is further oxidized to at least partially convert polymeric species 20 into an inorganic oxide ceramic. The inorganic oxide ceramic will be preferentially formed at the interfaces 26 defining the boundaries between domains 24 and 20. In preferred embodiments, in order to provide desirable chemical and thermal resistance, the inorganic oxide ceramic will be present in a layer at the interface that is at least 1 nm in thickness. In some embodiments, the step involving the removal of polymeric species 22 and the step of forming the inorganic oxide comprise one step, or, in other words, the steps are performed simultaneously under the same conditions. It is also contemplated that by using suitable oxidizers that have specificity for the domains comprised of polymeric species containing the inorganic species that is to be oxidized to form the ceramic, it may be possible to first form the inorganic oxide ceramic and then subsequently, in a separate step, degrade and remove polymeric species 22.

Figure 7:
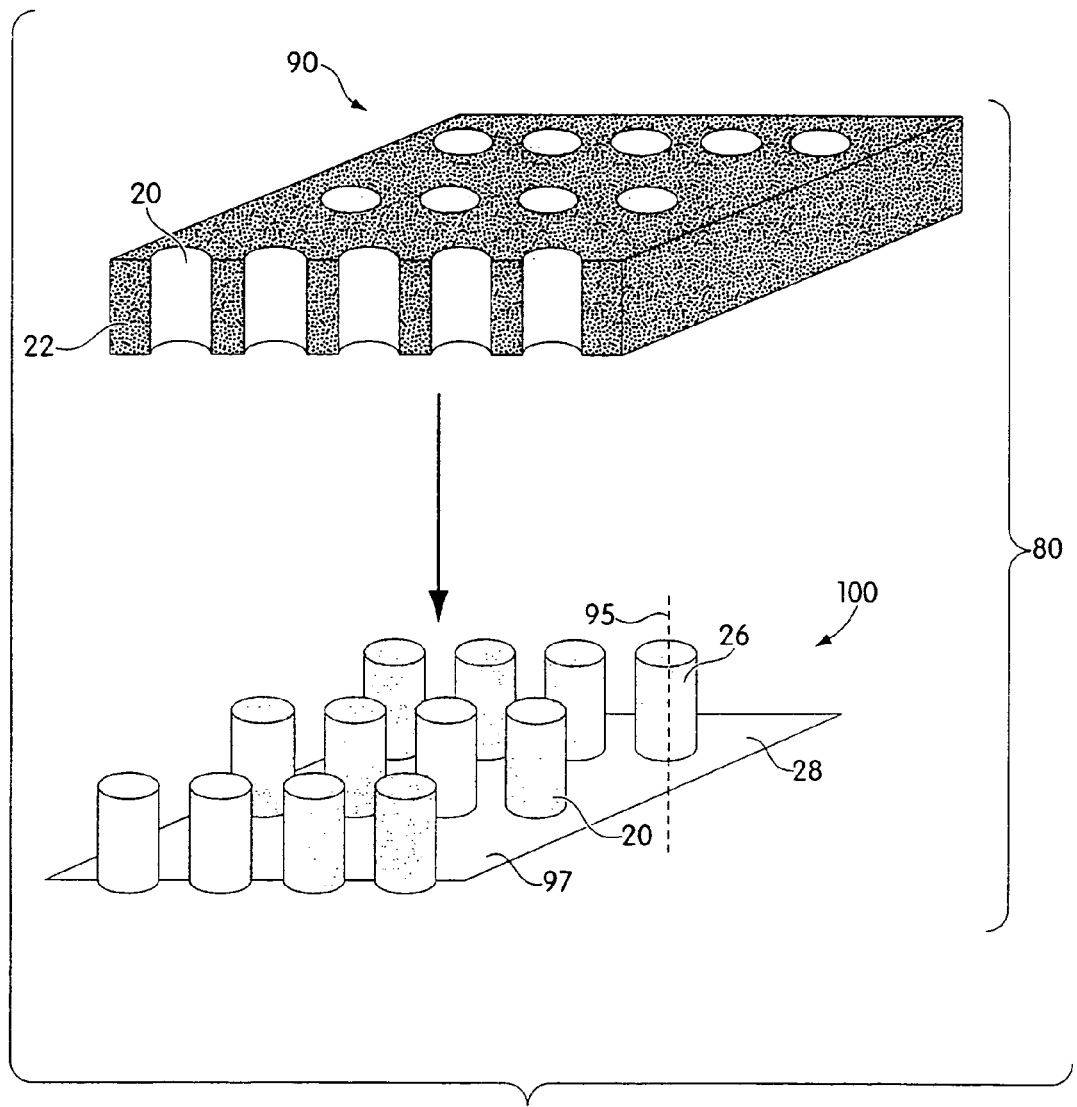
FIG. 7 is a schematic flow diagram showing a method for making a periodically structured relief article.

FIG. 7 shows a process 80 for producing a substrate-supported periodic relief nanostructure 100 according to one embodiment of this aspect of the invention. The process is analogous to that of FIG. 6 except that polymeric article 90 is arranged such that cylindrical domains 22 comprise the polymeric species resistant to degradation, for example those containing the inorganic species which forms an inorganic oxide ceramic 26 while polymeric species 20 is susceptible to degradation and removal, for example by oxidation and/or radiation. In the embodiment illustrated, the relief structure is formed on and supported by a substrate layer 28 and the cylindrical domains 20 are oriented with their longitudinal axes 95 oriented essentially perpendicular to the surface 97 of the substrate to which the article is in contact. As before, the relief structures obtainable by the method are not limited to the two-dimensionally periodic structure illustrated, but may be any one-, two-, or three-dimensionally periodic structure. The orientation of the domains with respect to the substrate can be controlled by the methods of forming the article on the substrate as discussed above. In some embodiments, the polymeric article 90 can be formed directly on substrate 28 by casting a thin layer of a polymer solution (or "polymeric layer") onto the substrate and subsequently converting the layer into the polymeric article, as described above. In such embodiments, the polymeric article 90 is converted to a relief structure while it is attached to the substrate. In alternative embodiments, polymeric article 90 may be formed, for example by casting onto the surface of a solvent, independent of substrate 28 and subsequently attached to the substrate before formation of the relief structure, or, in some embodiments where the non-degraded domains are interconnected, after formation of the relief structure. It should also be understood that the porous structures described in the context of FIG. 6 may be similarly prepared on the surface of a substrate.

Methods for degrading polymers using reactive gases such as ozone have been well studied (see Razumovskii et al. "Degradation of Polymers in Reactive Gases", *Europ. Polymer J.* 7: pp. 275-285 (1971) herein incorporated by reference). Degradation of polymers by oxygen plasmas, such as by oxygen reactive ion etching (oxygen-RIE) is also known (see for example Taylor G. N. and Wolf T. M. "Oxygen Plasma Removal of Thin Polymer Films", *Polymer Engineering and Science,* 20: p. 1087 (1980) herein incorporated by reference). Any of the above methods, modifications thereof, or alternative suitable methods can potentially be useful forming the porous and relief nanostructures according to the present invention. It is also known that exposure of silicon-containing polymers to oxidizing conditions, such as oxygen-RIE can result in the formation of $SiO_x$ ceramics (for example see Hartney et al. (a), (b), and (c) all previously cited). While any suitable means of polymer degradation, and any chemical oxidizer may potentially be useful, preferred methods for forming the ceramic articles provided by the invention involve either exposing a precursor polymeric article to either an oxygen plasma and/or ozone optionally coupled with exposure to radiation, such as UV light, or exposure to heat. The domains comprised of polymeric species, such as copolymer blocks, that do not contain the inorganic species but instead are degradable (e.g. contain unsaturated bonds in the polymer backbone) are preferably degraded by ozone, optionally combined with exposure to UV light and/or heat. If the domains are comprised of polymeric species, such as copolymer blocks, that do not contain the inorganic species or unsaturated bonds in the backbone, but instead are comprised of a traditional resist material such as PMMA, then such domains are preferably degraded and removed by a suitable lithography method which is known in the art, such as exposure to 193 nm UV light or to an electron beam. After such degradation and removal, the remaining domains, which are comprised of polymeric species containing an inorganic species capable of forming a ceramic oxide, can be at least partially converted to an inorganic oxide ceramic by either further ozone exposure, a combination of exposure to ozone, and UV and/or heat, or exposure to an oxygen plasma. In other preferred embodiments, the ceramic structure is produced in a single step by exposure of the precursor polymeric structure to oxygen-RIE.

The ozone exposure step (ozonolysis step) of some preferred methods according to the invention can utilize either gaseous ozone or liquid solutions of dissolved ozone, for example ozone dissolved in dichloromethane. The concentration of ozone in the reaction mixture can range from about 0.1% wt to 100% wt, with a typical value being about 2% wt in an air or $O_2$ solution. When coupled with UV exposure, the UV is typically of a wavelength around 254 nm. The reaction is allowed to proceed until a desired amount of the domain(s) have been degraded, and, if performing a one-step process for simultaneously forming a ceramic oxide, a desired amount of inorganic oxide ceramic has been formed. The resulting structures can then be soaked in a liquid (for example water or ethanol) in order to leach out the degraded polymeric material, thus yielding a porous or relief structure.

Oxygen plasma etching or oxygen-RIE for formation of the inorganic oxide ceramic and/or removal of polymeric species can be performed utilizing a variety of etch tools ranging from conventional plasma ashers to parallel plate configurations with magnetic enhancement both well known in the art. Either high or low gas pressures may be utilized depending on whether isotropic or anisotropic etching is desired with higher gas pressures generally yielding more isotropic etching as understood in the art. In a preferred method, a parallel plate configuration with magnetic enhancement and sample cooling is utilized; such units are well known in the art and commercially available. Typical conditions for performing oxygen plasma etching are known in the art and can be found, for example, in Hartney, et al. (c) herein incorporated by reference.

Various screening methods can be used for predicting and determining the success of the use of various candidate components and techniques in the inventive methods for producing the ceramic articles, and for determining the structure and composition of the articles produced. The chemical composition of the domains which form the inorganic oxide ceramics both before and after conversion of the precursor polymeric species into the ceramic can be examined by X-ray photoelectron spectroscopy (XPS). For example, when the domains which form the inorganic oxide ceramics are comprised of silicon-containing polymeric species, such as silicon-containing blocks of a block copolymeric species, the binding energy of the Si2p peak, which reflects the chemical environment of the silicon, can be monitored. It is well known that the binding energy of silicon in a hydrocarbon environment lies between 100.5 and 101.5 eV, whereas the binding energy of silicon present in an oxidized ceramic ($SiO_2$) environment is about 103.5 eV. Conversion of the surface of the domains to an inorganic oxide ceramic can also be monitored by measuring the surface energy of the article both before and after oxidation using contact angle measurements. The thickness of the inorganic oxide ceramic layer can be determined by depth profiling using Auger electron spectroscopy (AES) or by variable angle XPS techniques known in the art. The morphology and periodic structure of the ceramic articles can be examined by the methods described previously for the polymeric articles, for example TEM, scanning electron microscopy (SEM) and/or atomic force microscopy (AFM).

The porous and relief articles provided by the invention can be used for a wide variety of novel applications. For example one-, two-, and three-dimensionally periodic porous articles provided by the invention (for example article 70 of FIG. 6) can be used as membranes. Articles produced according to the invention when used as membranes preferably include a plurality of void spaces which define a plurality of pores. The membrane articles will preferably be cast as thin films having two opposing sides in contact with the surroundings. At least a fraction of the pores in the structure should form a continuous pathway connecting the two sides and providing fluid communication (convective and/or diffusive) between the two sides. Such membranes as provided according to the invention can have many beneficial and desirable advantages compared to prior art membranes. Since, in some preferred embodiments, the surface of the pores will be comprised of a layer of an oxidized polymeric species forming an inorganic oxide ceramic (hereinafter also referred to as a "ceramic membrane"), such membranes will possess excellent physical stability, chemical resistance, and temperature resistance (e.g. the ceramic membranes according to the invention could be used at service temperatures in excess of about 400 degrees C. and with aggressive organic solvents). Accordingly, the membranes may be used in harsh environments where typical polymeric membranes are unsuitable. In one preferred embodiment, ceramic membranes produced according to the invention can be advantageously utilized as a temperature and chemically resistant permi-selective protective coating layer on a variety of materials benefiting from such protection.

In addition, for embodiments where the precursor polymeric articles are arranged by self-assembly, especially by self-assembly of block copolymers, unique pore structures are attainable, such as three-dimensionally continuous interconnected porous structures with a double gyroid or double diamond pore morphology characterized by a plurality of nodes present at the branch points where porous pathways meet. Such three-dimensional porous morphologies could readily be made into conducting networks by coating or filling the pores with a conducting material such as a metal, or into unique catalytic substrates, providing controllable molecular diffusion characteristics, by coating or filling the pores with a catalytic material.

Membranes provided by two-dimensionally periodic porous structures with essentially circular cylindrical pores are potentially useful for a variety of applications involving filtration, diffusion, osmosis, etc. The inventive two dimensionally-periodic membranes can provide a high density of parallel, non overlapping, non-intersecting pores that have essentially uniform and controlled dimensions. The dimensions of the pores are defined by the dimensions of the corresponding domain in the precursor polymeric article from which the porous membrane is produced according to the methods of the invention. Therefore, the pore size can be controlled by any of the means discussed previously for controlling characteristic domain size (e.g. controlling the molecular weight of the polymeric species comprising the domain, addition of supplemental modifiers, etc.). The porous structure of the membranes according to the invention may also be advantageously globally oriented within the article by techniques well known in the art, such as rollcasting or spin casting of the precursor polymeric article prior to creating the porous structure as previously discussed.

Typical membranes provided by the invention can provide a pore density of between about $10^3$ and about $10^{12}$ pores per square centimeter of membrane surface, with the most typical membranes having at least $10^{10}$ pores per square centimeter of membrane surface with a substantial fraction, typically at least about 40%, of those pores being continuous throughout the membrane so as to connect both sides. The characteristic minimum dimensions of the pores are controllable by controlling the characteristic domain dimension in the precursor polymeric structure as discussed earlier. Typically, characteristic minimum dimensions of the pores ranging from about 1 nm to about 1 μm, and more typically from about 20 nm to about 1 μm are attainable.

The porous and relief structures provided according to the invention are also useful as photonic band gap articles which provide selective barriers to transmission of electromagnetic energy. A typical photonic band gap article will inhibit the propagation of electromagnetic radiation having wavelengths on the order of the periodicity length of the periodic structure of the article, provided that there is a sufficient difference in dielectric constant between adjacent, dissimilar domains within the structure. The articles can inhibit electromagnetic wave propagation in one direction, two directions, and an infinite number of directions corresponding to the dimensionality of the periodicity of the periodic structure (For a fuller discussion of photonic band gaps (see Joannopoulos, et el., "Photonic Crystals, Molding the Flow of Light", Princeton University Press, Princeton, N.J., 1995). For embodiments involving ceramic articles, due to the large difference in dielectric constant between domains containing inorganic oxide ceramics and the domains at least partially comprised of void space in the present articles, and due to the ability to form such articles into structures with regular periodicity having periodic lengths on the order of the wavelengths of a wide range of electromagnetic radiation, the articles provided by the present invention may be fabricated to provide band gap articles superior in performance to conventional polymeric band gaps.

The novel porous and relief articles are also useful for providing low dielectric constant articles useful for various applications, for example intermetal dielectric applications for integrated circuits (see Hendricks, N. H. "Organic Polymers for IC Internet Dielectric Applications. *Solid State Technol.* 117: p. 122 (1995)). As one example, a porous ceramic article having a three-dimensionally periodic structure with a double gyroid morphology (e.g., one produced from the polymeric article 32 shown in FIG. 4 by degrading and removing polymeric species 22 and oxidizing a polymeric species 20 to form an inorganic oxide ceramic) can yield an article with an effective dielectric constant less than three, and in some embodiments less than two. These low effective dielectric constants are attainable because a substantial fraction of the structure is comprised of void space, typically filled by air which has a dielectric constant of only one compared to four for a typical inorganic oxide ceramic ($SiO_x$). In general, the effective dielectric constant of the overall structure will be proportional to the sum of the volume fractions of each domain multiplied by the dielectric constant of the domain. Conventional polymeric dielectric materials can suffer from poor thermal stability, while conventional ceramic materials have had too high a dielectric constant to be useful. The current, inventive ceramic porous structures can provide the thermal stability of a ceramic while having a much lower effective dielectric constant than the pure ceramic material.

The porous and relief articles provided by the invention are also useful as molds with which to form periodic molded structures from liquid and/or solid materials that are typically incapable of forming such structures by self assembly. A "molded structure" as used herein refers to a structure that is formed by adding a material to a mold provided by the invention by filling or coating one or more domains within the mold, which are at least partially comprised of void space, with a desired material. Thus, the desired material will be formed into a "molded structure" having a structure essentially equivalent to the domain in which the material was placed. The periodic structure of the molded structure will be characterized by domains that are defined by the polymeric self-assembly of the polymeric species initially forming the domain in the precursor polymeric article from which the mold was derived. Thus, the invention can provide novel molded articles providing molded structures comprising periodic structures formed of non-self-assembleable materials that cannot be formed into such structures by typical known fabrication methods. Such articles advantageously display periodic structures defined by self-assembly of polymeric species. Periodic molded structures that are "defined by self-assembly of polymeric species" refer to molded materials having a structure that is substantially similar to at least one domain of the self-assembled periodic polymeric article from which the mold forming the article was derived. Such molded articles can provide unique structures with relatively easily controllable one-, two-, and three-dimensional periodicity not typically obtainable by lithography or other typical nanofabrication methods.

Porous and relief structures useful as molds according to the invention should provide void spaces that provide a continuous pathway for fluid communication with the atmosphere surrounding the structure to allow the void spaces to be filled with the desired material. Unlike applications involving use of the inventive articles as membranes, it is not always essential for the void spaces of the mold article to connect two opposing sides of the article. It is only necessary, and in certain embodiments advantageous, that the void spaces have a single outlet in communication with the surroundings. In other words, the void spaces in molds according to the invention may act like cups as opposed to pipes for certain embodiments.

The molds provided according to the invention may be used for a wide variety of purposes. The ceramic coating present on the surfaces of the molds provided according to certain embodiments of the invention allows such molds to be used in conjunction with materials and conditions not possible with traditional polymeric materials. For example ceramic molds may be used to form periodic structures from molten materials at temperatures above the typical degradation temperatures of polymeric materials (e.g. a ceramic mold according to the invention may be used to form a periodic structure of a metal with a melting temperature exceeding about 200-400 degrees C. by first filling the voids of the mold with the liquid metal and then letting it solidify. In addition, ceramic molds may be used with aggressive solvents and/or reactants for which typical polymers are unsuitable. In some embodiments, the void spaces in the ceramic or non-ceramic polymeric molds may be filled with conducting materials such as metals or conducting polymers in order to provide conducting networks. In other embodiments, the void spaces in the ceramic or non-ceramic polymeric molds may be filled with a material having a high dielectric constant, preferably a material with a dielectric constant greater than about 3, more preferably greater than about 5, more preferably greater than about 8, more preferably greater than about 8.5 and most preferably greater than about 10, such as tellurium, barium, strontium, magnesium, lead, salts thereof, or other high dielectric constant materials known in the art. Such embodiments can provide novel high dielectric constant materials having a periodic structure that have a dielectric constant exceeding that of typical periodically structured materials. Such periodically structured materials provided according to the invention preferably have a dielectric constant greater than about 3, more preferably greater than about 5, more preferably greater than about 8, more preferably greater than about 8.5 and most preferably greater than about 10.

Alternatively to filling the voids of the various mold structures, the pore surfaces within the mold structure could instead be coated with a thin coating of a material. In one such embodiment, the voids can be coated with a thin layer of a metal by known methods in the art, such as electroplating, electroless deposition, etc. The various molds provided by the invention can also be used as chemical reaction vessels, providing a periodic template, for polymerization. For example, in one embodiment, since they have sufficient chemical resistance, the inventive ceramic molds may be used as templates for performing polymerization of aggressive monomers to form periodic polymeric structures of polymers which normally cannot form such structures by self-assembly. For example, fluorine containing polymers, such as poly(tetrafluoroethylene), may be formed into nanoscale periodic structures by such a method.

Preferably, the molds according to the invention, provide surfaces in contact with the material to be molded which are essentially impermeable to the material so that the article resulting from filling or coating the void spaces in the mold with the material will have periodically occurring separate domains, at least one of which is at least partially formed of the material added to the void spaces of the mold, with the domains not formed of the material being essentially free of the material. If it is desired, the mold structure can be removed from the molded material to yield the molded structure alone, surrounded by one or more domains comprised of void space which were previously occupied by the polymeric or ceramic mold structure. In this way, stand-alone molded articles may be formed. Such structures are typically formed on a supporting substrate as discussed previously with regard to FIG. 7. The mold structure may be removed from the molded article, if desired, by a variety of means known in the art, for example before addition of the material to be molded, the mold could be coated with a release agent so that the molded structures may be easily removed, or the mold may be dissolved or chemically degraded, for example for molds including silica glass, the silica can be dissolved with hydrofluoric acid, or for a ceramic mold being used to form a periodic article from a fluorine-containing polymer, the ceramic mold structure could be removed from the molded article with a fluorine plasma.

In one particularly preferred embodiment, the molds may also be used to form ordered structures of magnetic materials. For example, a porous structure with a periodic array of non-interconnected void spaces could advantageously be used as a mold to form ordered structures of magnetic materials. Such ordered structures of magnetic materials could advantageously be used as magnetic coatings for magnetic storage devices such as flexible magnetic tapes and discs, and hard disc drives. In some embodiments, molds, according to the invention can allow a high surface density of individual domains including a magnetic material to be formed on a substrate, enabling magnetic storage media which can potentially have dramatically increased storage capacity, when compared to conventional designs.

The novel magnetic articles produced using the mold structures provided by the invention may be formed, for example, by forming a polymeric article on a substrate and at least partially removing at least one of the domains of the polymeric article to form a void space, into which is subsequently added a magnetic material. The porous mold structure used for forming the magnetic articles can be formed, as previously described, either by coating a substrate with a thin polymeric layer or film and subsequently converting the layer into the phase separated polymeric article, which article is subsequently converted into a mold structure by selectively removing at least one of the domains, or, alternatively, by forming the periodically structured polymeric article separate from the substrate and subsequently attaching the article to the substrate, either before or after removal of at least one of the domains to form a mold structure.

After adding a magnetic material to the void spaces of the mold structure deposed on the surface of a substrate, if desired, the mold structure may be removed from the substrate leaving behind a periodic array of magnetic domains on the substrate that are at least partially surrounded by void space. For an embodiment involving a two-dimensionally periodic mold structure with cylindrical void spaces, the resulting magnetic article can be similar to structure 100 shown previously in FIG. 7. However, in many cases, the mold structure will have little or no detrimental effect on the desired performance of the magnetic article, in which cases the to mold structure may simply be left in place on the substrate, so that the domains including a magnetic material are at least partially surrounded by the material comprising the mold structure (for example, a polymeric material, or an oxidized polymeric species forming an inorganic oxide ceramic).

Magnetic articles produced with mold structures provided by the invention may possess a one-, two-, or three-dimensionally periodic structure. Preferably, each domain of the structure that includes a magnetic material is non-interconnected to other domains including a magnetic material. In particularly preferred embodiments, the magnetic article includes a plurality of domains including a magnetic material which exhibit two-dimensional periodicity, and which are arranged as an array of cylinders on the substrate. In the most preferred arrangement of such embodiments, the cylindrical magnetic domains are arranged in a hexagonal array and formed on the substrate so that their longitudinal axes are non-coplanar to the surface of the substrate that is in contact with the magnetic domains. In some especially preferred embodiments, the cylindrically-shaped magnetic material is arranged as an array of cylinders on the surface of the substrate such that the longitudinal axes of the cylinders are essentially perpendicular to the surface of the substrate. A similar arrangement of cylindrical domains was shown previously in FIGS. 3 and 7.

A "magnetic material" as used herein refers to any material which consists of or includes a species capable of forming a permanent magnet. Such species are well known in the art and include, but are not limited to, cobalt, nickel, iron, alloys of cobalt and platinum, alloys of cobalt and iron, oxides of any of the species above, and ferrites, such as barium ferrite. In some embodiments, the magnetic material can comprise an essentially pure magnetic species. In other embodiments, the magnetic material can comprise a mixture of magnetic and non-magnetic species, an organic or polymeric species containing covalently or non-covalently attached magnetic species, mixtures of the above, or any other suitable magnetic materials as apparent to those of ordinary skill in the art.

Magnetic material can be added to the voids of the inventive mold structures in order to form the magnetic articles according the invention by a variety of methods known in the art. In some embodiments, a molten magnetic material, for example a molten magnetic metal, may be added to void spaces and subsequently allowed to solidify. For such embodiments, where the liquid metallic material has a melting temperature that exceeds the degradation temperatures of typical polymers, it is preferable to utilize ceramic mold structures provided by the invention for forming the magnetic articles. In other embodiments, the magnetic material can be deposited into the void space by chemical and/or physical vapor deposition. For embodiments where the magnetic material is deposited by physical vapor deposition, the material can be deposited by various means known in the art, such as by evaporation or sputtering. For embodiments where the magnetic material is deposited by physical vapor deposition, since the magnetic material will typically not only fill the void spaces of the mold but also be deposited in a coating layer on the surface of the mold not in contact with the substrate, the mold structure, along with the coating layer, should be removed from the substrate in order to leave behind non-interconnected magnetic domains having the structure of the domains comprising the void spaces of the mold. In some preferred embodiments, the magnetic material is selectively deposited into only the void space of the mold by, for example, electrodeposition. For embodiments where the magnetic material is deposited by electrodeposition, the substrate upon which the magnetic article is formed should be formed of an electrical conductor, or, alternatively, the surface of the substrate that is in contact with the magnetic material can be coated with an electrical conductor prior to forming the magnetic article.

In preferred embodiments, magnetic articles are formed by at least partially filling, and more preferably essentially completely filling, the void spaces provided by the mold structures. "At least partially filling" as used herein refers to adding a magnetic material to a void space such that the magnetic material within the void space has a minimum characteristic dimension that is essentially equal to the characteristic dimension of the domain defining the void space. "Essentially completely filling" a void space with a magnetic material as used herein refers to adding the magnetic material to a domain comprising void space, such that after adding the magnetic material the entire domain consists essentially of the magnetic material. A domain that "consists essentially of the magnetic material" as used herein refers to a domain essentially entirely formed from a magnetic material as previously defined herein.

In order to provide magnetic articles having a high surface density of non-interconnected domains formed of a magnetic material, which have a desirable high information storage capacity, preferred magnetic articles according to the invention include domains including a magnetic material that have a characteristic dimension of between about 10 nm and about 50 nm. In the most preferred embodiments, adjacent domains including a magnetic material are separated from each other on the substrate by a distance not exceeding about 1 nm to about 20 nm.

The magnetic material chosen for forming the magnetic articles must be able to be deposited into the voids of the mold structure by whatever deposition method is chosen, for example filling of the pores with a liquid material, electrodeposition, sputtering, evaporation, or chemical vapor deposition. Selection of materials based upon the above criteria is well within the skill of those of ordinary skill in the art. In addition, in preferred embodiments, magnetic materials will be selected which have a relatively high saturation moment in order to give a relatively high readback signal, for example greater than or equal to about 100 emu/cm$^3$. The magnetic material should also be chosen to impart a desired degree of anisotropy to the magnetic article. Magnetic anisotropy is determined, at least in part, by the shape of the magnetic domains of the magnetic article, the saturation moment of the material, and the magnetocrystalline anisotropy of the magnetic material. The anisotropy of the magnetic article is preferably high enough to avoid superparamagnetic behavior, but is preferably not so high as to make the signal strength required for writing information to the article impractical or impossible. The net anisotropy of the magnetic article, and thus its coercivity (which is the field required to switch the polarity of the magnetic material) can be chosen based upon the needs and requirements of a desired specific application, and, based upon such requirements, the size, and shape of the magnetic material containing domains, as well as the particular magnetic material comprising such domains, can be selected according to principles well understood by those of ordinary skill in the art (for example, see, B D Cullity, *Introduction to Magnetic Materials*, Addison-Wesley, Reading Mass., 1972; and, D. Jiles, *Introduction to Magnetism and Magnetic Materials*, Chapman and Hall, London, 1991).

The function and advantage of these and other embodiments of the present invention will be more fully understood from the examples below. The following examples are intended to illustrate the benefits of the present invention, but do not exemplify the full scope of the invention.

Example 1

Synthesis of a Monomer Containing an Inorganic Species Capable of Forming a Ceramic Oxide p-Pentamethyldisilylstyrene (PMDSS) was prepared in a manner similar to that described by Kawakami, Y., Hisada, H., Yamashita, Y. "Polystyrenes With p-Oligo-siloxane, Silane Germanosiloxane, Germane, or Stannane as p-Substituents as Materials for Oxygen Permeable Membranes", *J. Polym. Sci. Polym. Chem.* 26: pp. 1307-1314, herein incorporated by reference. Briefly, in a 500 ml three-neck flask equipped with mechanical stirring, a solution of 9.14 g of magnesium turnings in 100 ml tetrahydrofuran (THF) were activated with 10 drops of 1,2-dibromoethane and the mixture was heated to a gentle reflux under a nitrogen atmosphere. To the above, p-chlorostyrene (48 g, 346 mmol) was added slowly while continuously stirring until the mixture began to foam and reflux vigorously. At that point, heating was discontinued and the remaining p-chlorostyrene was added to the mixture at a rate sufficient to maintain continuous refluxing. After the addition of the remaining p-=chlorostyrene, the mixture was heated to reflux for another 40 min. At that point, a solution containing 36.1 g (216 mmol) of chloropentamethyldisilane in 50 ml THF was added at 35 degrees C., and the final mixture was heated to 50 degrees C. and there maintained for 1 hour. The mixture was then cooled, diluted with hexane, and filtered through Celite. Solvent was then evaporated under vacuum, and the crude product was subjected to column chromatography on silica gel, eluting the product with petroleum ether in order to reduce the concentration insoluble products and products of side reactions. The final product from the column fractions was further purified by distillation (boiling point 72-74 degrees C. at 0.05 mmHg) to yield a clear oil containing the desired PMDSS.

Example 2

Synthesis and Characterization of poly(pentamethyldisilylstyrene) (P(PMDSS)) homopolymers, PI-b-P(PMDSS) AB Di-Block Copolymers, P(PMDSS)-b-PI BA Di-Block Copolymers, PI-b-P(PMDSS)-b-PI ABA Tri-Block Copolymers, and P(PMDSS)-b-PI-b-P(PMDSS) BAB Tri-Block Copolymers An anionic living polymerization procedure utilizing sec-BuLi as initiator and carried out in benzene was used for synthesizing P(PMDSS) homopolymers and the block copolymers. The procedure for synthesis of the P(PMDSS) homopolymers was essentially identical to that described by Hirao et al., previously cited and incorporated by reference, and will not be further discussed herein. The block copolymers were synthesized using a procedure modified from that of Hirao et al. as outlined below.

Prior to polymerization, PMDSS was purified following typical procedures utilized in the art for purifying styrene. The monomer was distilled over CaH$_2$ and dibutylmagnesium and the purified monomer was added to ampules which were used for the polymerizations. The distillation of the PMDSS was carried out at a temperature higher than that used for styrene monomer, since the boiling point of PMDSS (72 degrees C. at 0.5 mmHg) is higher than that of styrene (50 degrees C. at 0.5 mmHg).

In the following discussion, the following analytical methods were employed. Weight average molecular weight (Mw) was determined by SEC and LALLS. SEC determinations were carried out at 30 degrees C. using a Waters model 510 pump, Waters model 410 differential refractometer, and Waters model 486 tunable absorbance detector (Waters Corporation, Milford, Mass.). Three Phenomenex columns (Phenogel 5 linear type; pore size, 10 to 50 Å, Phenomenex, Torrance, Calif.) were used. THF distilled over CaH$_2$ and sodium was used as the carrier solvent, and was pumped at a flow rate of 1 ml/min.

LALLS determinations were performed using a Chromatix KMX-6 low angle laser photometer (LDC Analytical, Riviera Beach, Fla.). The instrument is equipped with a helium-neon laser and was operated at a wavelength of 633 nm. Mw values were obtained from plots of $(KC/\Delta R_\theta)^{1/2}$ versus C where $\Delta R_\theta$ is the excess Rayleigh ratio, K is a combination of known optical constants of the instrument, and C is the concentration of the polymer solution. The refractive index increments, dn/dc, in THF at 25 degrees centigrade were measured with a Chromatix KMX-16 refractometer (LDC Analytical, Riviera Beach, Fla.).

Determination of the composition of the materials was made by $^1$H NMR for materials dissolved in $CDCl_3$ (Deuterated Chloroform) at 30 degrees C. using a Varian Unity Plus 300/54 instrument (Varian, Palo Alto, Calif.).

Synthesis of a P(PMDSS) homopolymer as described above was performed. The homopolymer obtained had a measured weight average molecular weight of 38 kg/mole polydispersity of 1.06, and a Tg of about 100 degrees C.

Synthesis of the diblock and triblock copolymers proceeded by sequential addition of the monomers as follows. Two different AB and ABA copolymers were produced where A is poly(isoprene) (PI) and B is P(PMDSS). The first (referred to as ABA-1) was synthesized to have PI as the minority component, which would yield a double gyroid morphology of PI network domains in a matrix of P(PMDSS) (referred to as P(PMDSS-DG)) upon phase segregation, and the second (ABA-2) to have P(PMDSS) as the minority component, which would yield a double gyroid morphology of P(PMDSS) network domains in a matrix of PI (referenced to as PI-DG). For ABA-1 copolymers, 5 grams of a living poly(isoprene) block with a molecular weight of about 24,000 was synthesized in 100 milliliters of benzene using benzene as the solvent and including $2.08 \times 10^{-4}$ mole sec-BuLi as initiator. Following the synthesis of this block, a small quantity (0.5 ml) of THF was added to the mixture to promote the initiation of the P(PMDSS) block and maintain a narrow molecular weight distribution. It should be noted that when using the present technique to synthesize ABA tri-block copolymers, the two PI end blocks will have somewhat different molecular weights and molecular structure. The difference can be attributed to the small amount of the polar solvent THF that is present during the synthesis of the second PI block and involves an increase in the 3,4-component, and 1,2-component of the molecular structure compared as to PI synthesized in non-polar solvents (e.g. benzene).

PMDSS (18.3 g) was then added and the resulting mixture was allowed to react for 3 hr at 40 degrees C. to complete the desired degree of polymerization of the middle (B) block of P(PMDSS). At this point, an aliquot of the AB diblock copolymer was removed from the mixture for characterization. Monomer comprising the third block (4.38 g of isoprene monomer) was then added to the reaction mixture and the mixture was allowed to react for an additional 24 hr at room temperature to synthesize the third block (PI). The resulting ABA tri-block copolymers were then purified by dissolving the polymer samples in toluene and adding about 0.5% w/v methanol at room temperature until turbidity was detected. The mixture was then heated and stirred until clear, transferred to a warm separatory funnel and allowed to equilibrate over night. The purified tri-blocks were then recovered in the lower phase from the separatory funnel.

For ABA-2 copolymers, the reaction scheme was essentially the same as above except that the molecular weight of the initial living PI block was about 44 kg/mol, and the relative amounts of the different monomers and reaction times were adjusted to yield the desired molecular weights for the individual blocks.

BA-type diblock copolymers and BAB-type (P(PMDSS)-b-PI-b-P(PMDSS)) tri-block copolymers were also produced. The reactions used were similar, except that the order of the monomer addition was reversed and the relative amounts of the different monomers and reaction times were adjusted to yield the desired molecular weights for the individual blocks. Also, the small amount of THF was added just before the polymerization of the final P(PMDSS) end block, after the middle PI block has been polymerized.

The molecular characteristics of the polymers synthesized are given in Table 1. The table indicates that the ABA-1 tri-block copolymer (see rows 1-3) had a molecular weight of approximately 24,000/100,000/26.000 for the A, B, and A blocks respectively, contained about 36% wt PI and had a polydispersity of about 1.12. The ABA-2 tri-block copolymer (see rows 4-6) had a molecular weight of approximately 44/168/112 for the A, B, and A blocks respectively, contained about 51% wt PI and had a polydispersity of about 1.18. The BAB-1 tri-block copolymer (see rows 4-6) had a molecular weight of approximately 52,000/250,000/42,000 for the B, A, and B blocks respectively, contained about 74% wt PI and had a polydispersity of about 1.24. The BAB-2 tri-block copolymer (see rows 7-9) had a molecular weight of approximately 44,000/167,000/46,000 for the B, A, and B blocks respectively, contained about 65% wt PI and had a polydispersity of about 1.06. The BAB-3 tri-block copolymer (see rows 10-12) had a molecular weight of approximately 44,000/148,000/120,000 for the B, A, and B blocks respectively, contained about 47% wt PI and had a polydispersity of about 1.3. The BAB-4 tri-block copolymer (see rows 13-15) had a molecular weight of approximately 44,000/167,000/112,000 for the B, A, and B blocks respectively, contained about 52% wt PI and had a polydispersity of about 1.06.

TABLE 1

Molecular Characterization of Homopolymers, Di-Block, and Tri-Block Copolymers Produced According to Example 1

| Sample | Mw × 10$^{-3}$ (g/mol) | Polydispersity | wt % PI |
|---|---|---|---|
| ABA-1 | | | |
| PI | 24 | | 100 |
| PI-b-P(PMDSS) | 123 | | 18 |
| PI-b-P(PMDSS)-b-PI | 149 | 1.12 | 36 |
| ABA-2 | | | |
| PI | 44 | | 100 |
| PI-b-P(PMDSS) | 212 | | 21 |
| PI-b-P(PMDSS)-b-PI | 324 | 1.18 | 51 |
| BAB-1 | | | |
| P(PMDSS) | 52 | | 0 |
| P(PMDSS)-b-PI | 302 | | 80 |
| P(PMDSS)-b-PI-b-P(PMDSS) | 345 | 1.24 | 74 |
| BAB-2 | | | |
| P(PMDSS) | 44 | | 0 |
| P(PMDSS)-b-PI | 211 | | 79 |
| P(PMDSS)-b-PI-b-P(PMDSS) | 257 | 1.06 | 65 |
| BAB-3 | | | |
| P(PMDSS) | 44 | | 0 |
| P(PMDSS)-b-PI | 192 | | 77 |
| P(PMDSS)-b-PI-b-P(PMDSS) | 312 | 1.3 | 47 |
| BAB-4 | | | |
| P(PMDSS) | 44 | | 0 |
| P(PMDSS)-b-PI | 211 | | 79 |
| P(PMDSS)-b-PI-b-P(PMDSS) | 323 | 1.06 | 52 |

Example 3

Preparation of Three-Dimensionally Periodically Structured Polymeric Articles Microphase-separated polymeric articles were prepared from the ABA-1, BAB-1, and BAB-4 tri-block copolymers produced according to Example 2. The articles were prepared by bulk casting which entailed preparing a 5% wt solution of the block copolymers in toluene, and allowing the toluene to slowly evaporate at room temperature for one week. After casting, the polymer films were approximately 0.7 mm thick. The resulting samples were then annealed at 120 degrees C. in a vacuum oven for two weeks.

The microphase-separated morphology of the structures was examined by TEM. Thin sections, approximately 500-1000 Å, of the bulk-cast, annealed samples were prepared by cryo-microtomy at −90 degrees C. using a diamond knife-equipped Reichert-Jung 4E cryo-ultramicrotome (Reichert Jung Optische Werke A G, Wein, Austria). The sections were transferred to 600 mesh copper grids or carbon film-coated 100 mesh copper grids, and the PI blocks were preferentially stained in the vapor produced by a 4% wt osmium tetroxide aqueous solution for 2 hr. The sections were then observed in bright field mode using a JEOL 2000FX transmission electron microscope (JEOL, Peabody, Mass.) operating at 200 kV. A goniometer stage with a double tilt holder was used to obtain high-symmetry two-dimensional projections of the morphology. Photographic negatives were made of the resulting projections.

The space group of the structure of the articles was investigated by obtaining diffraction patterns of the negatives using an optical diffractometer equipped with a 5 mW polarized UniPhase helium-neon laser producing light with a wavelength of 633 nm (UniPhase, San Jose, Calif.). Polaroid film was exposed for 1/16 s to record the optical diffraction images. Up to fourth-order peaks were seen in the optical transforms of the negatives, and these correlated well to computer simulated fast Fourier transforms (FFTs) of the digitized images. FFTs were made from the TEM images using a montage of 32×32 unit cells in a 1024×1024 pixel array. A computer program was used to reduce edge effects in the FFT, by using a Hanning window algorithm and produce a two dimensional image from the data (see for example Gonzalez, R. C. et al. "Digital Image Processing," Addison-Wesley Publishing Co., Reading, Mass., herein incorporated by reference). The characterization of the microdomain morphology was made by combining the data obtained by TEM, optical diffraction patterns, and digitized FFTs.

Figure 8:
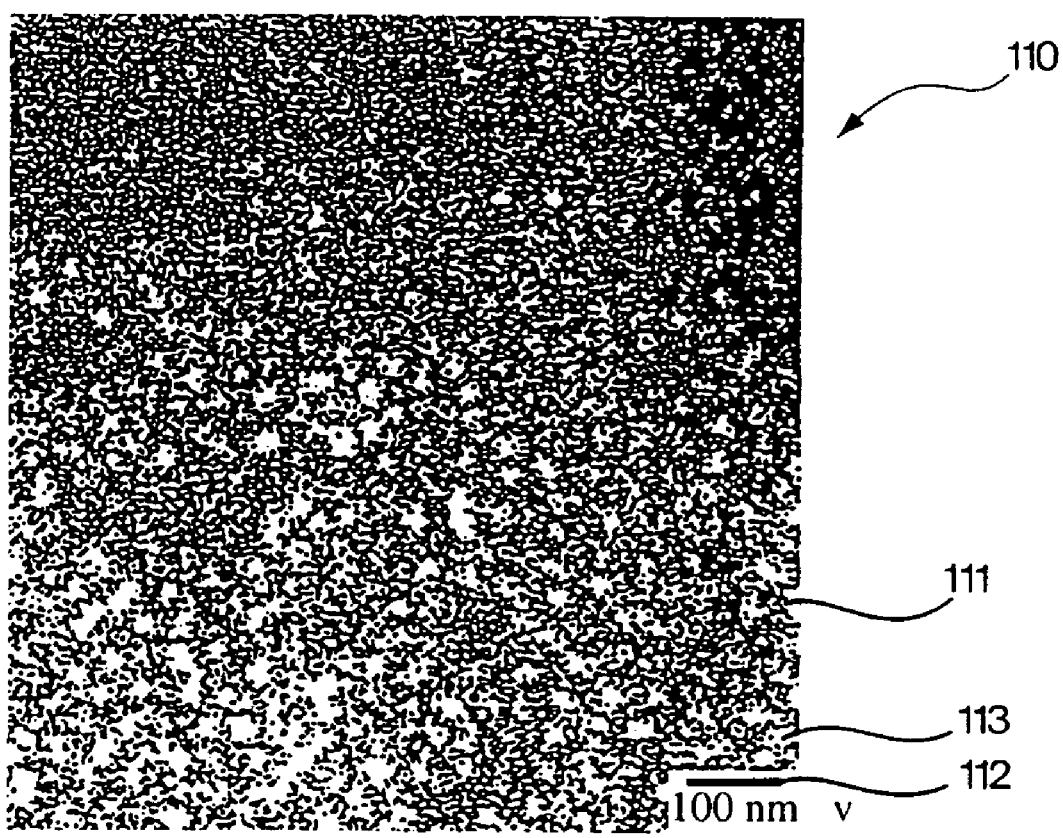
FIG. 8 is a photocopy of a bright field TEM image of a thin section of a three-dimensionally periodic polymeric article produced according to one embodiment of the invention.

FIG. 8 shows a bright field TEM image 110 of the tri-block copolymeric article comprised of the P(PMDSS)-b-PI-b-P(PMDSS) (BAB-1) copolymer produced according to Example 2. The scale 112 in the figure represents a length of 100 nm. The PI domains 111 in the figure appear dark, while the P(PMDSS) domains 113 appear bright. The sample exhibits spheres 113 of P(PMDSS) in a PI matrix 111.

Figure 9:
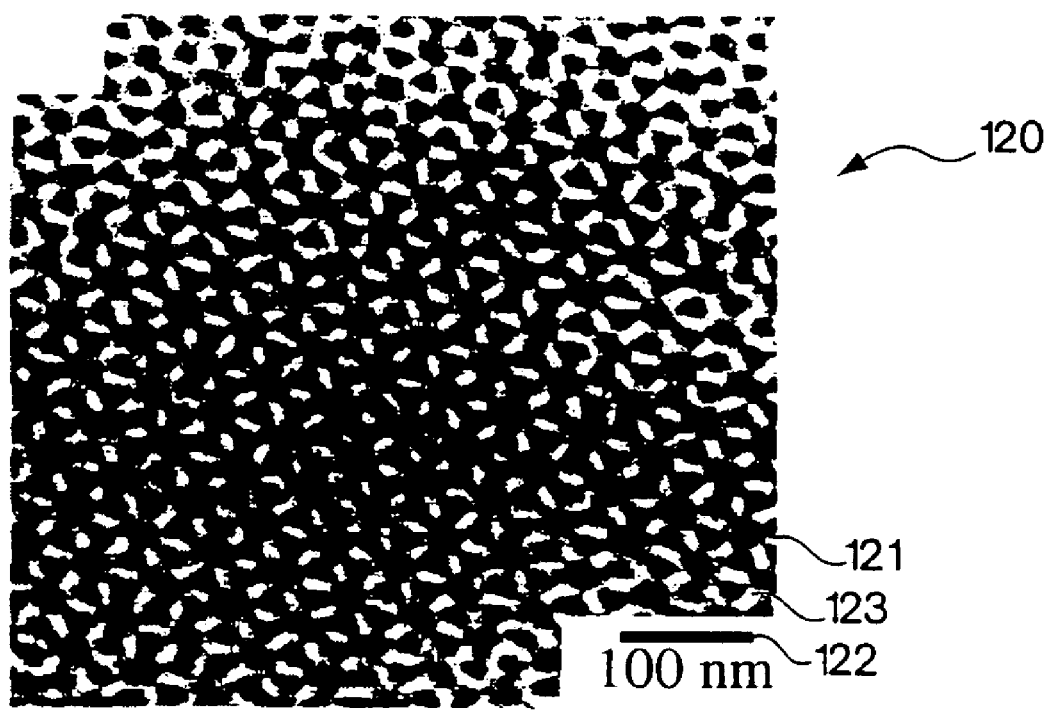
FIG. 9 is a photocopy of a bright field TEM image of a thin section of a three-dimensionally periodic polymeric article produced according to one embodiment of the invention.

FIG. 9 shows a corresponding TEM image 120 of the tri-block copolymeric article comprised of the PI-b-P(PMDSS)-b-PI 24/100/26 (ABA-1) copolymer produced according to Example 2. The scale 122 in the figure represents a length of 100 nm. The PI domains 121 in the figure appear dark, while the P(PMDSS) domains 123 appear bright. The PI domains 121 form the minority phase and appear as two dark interpenetrating networks within a P(PMDSS) matrix 123. The sample exhibits long range order.

Figure 10A:
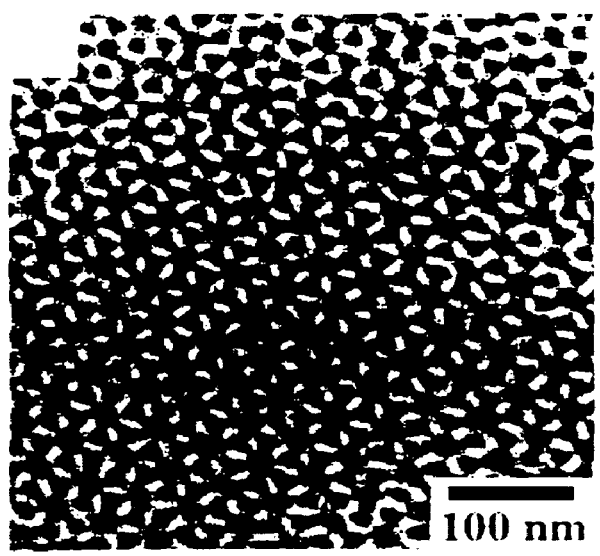
FIGS. 10 a-f are photo copies of a series of three bright field TEM images exhibiting three different projections of thin sections of a three-dimensionally periodic polymeric article produced according to one embodiment of the invention (FIGS. 10 a-c) along with photocopies of their corresponding digitized FFTs FIGS. 10 d-f.
Figure 10B:
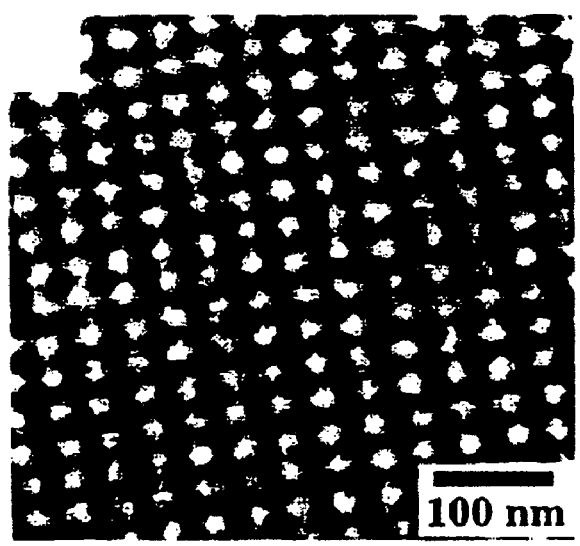
Figure 10C:
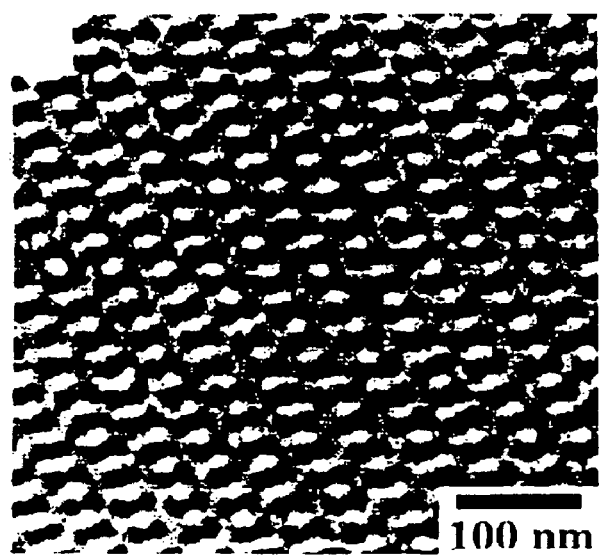
Figure 10D:
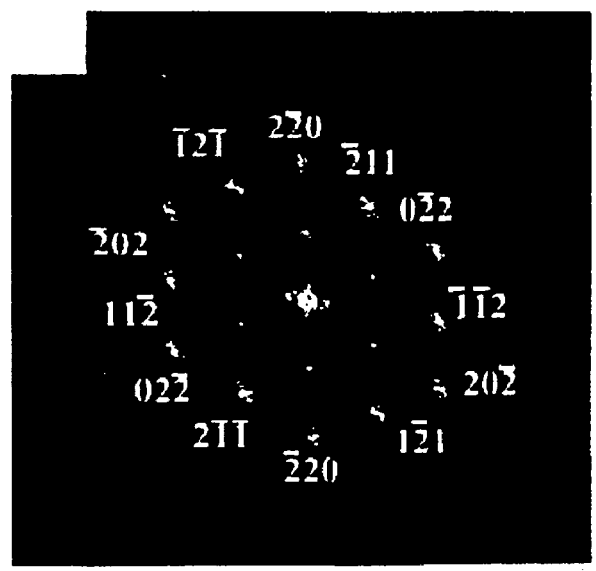
Figure 10E:
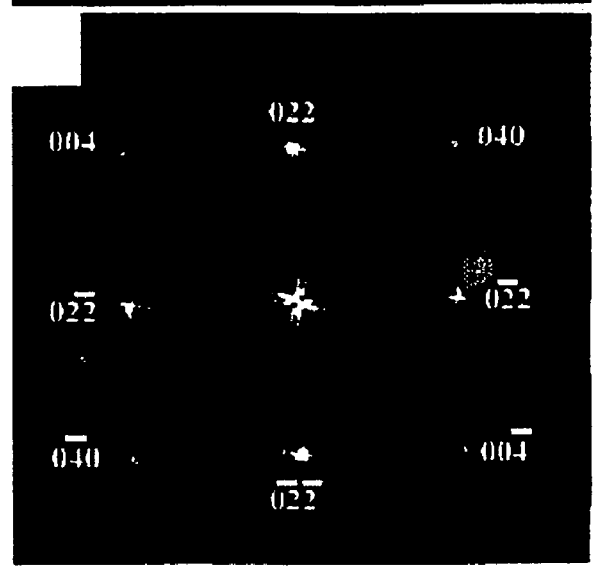
Figure 10F:
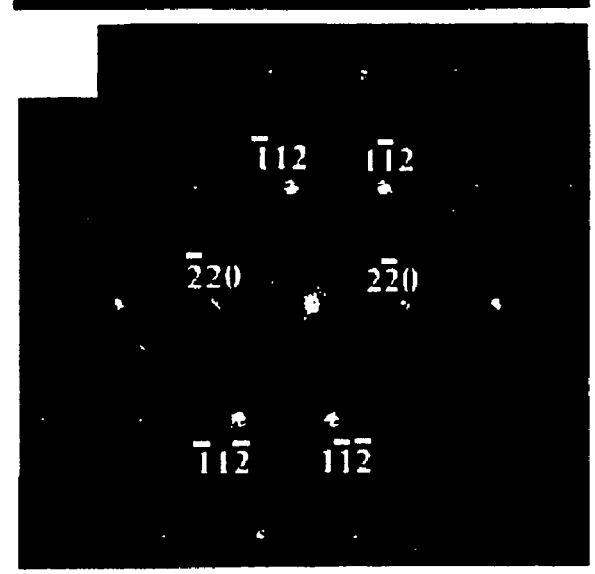

FIGS. 10a-f shows a series of two dimensional projections of bright field TEM images (FIGS. 10a-c), and their corresponding indexed digitized FFTs (FIGS. 10d-f) for the tri-block copolymeric article comprised of the ABA-1 copolymer produced according to Example 2. FIGS. 10a and 10d exhibit the [111] projection, FIGS. 10b and 10e the [100] projection, and FIGS. 10c and 10f the [110] projection. FIGS. 10a and 10d show a TEM image (FIG. 10a) with p6 mm symmetry and its corresponding digitized FFT pattern (FIG. 10d) indicative of a sample exhibiting double gyroid morphology with Ia3d space group symmetry. FIG. 10b and FIG. 10e show a TEM image (FIG. 10b) with p4 mm symmetry and its corresponding digitized FFT pattern (FIG. 10e); this FFT also indexes well according to the DG model. FIG. 10c and FIG. 10f show a TEM image (FIG. 10c) with c2 mm symmetry and its corresponding digitized FFT pattern (FIG. 10f); this FFT also indexes well according to the DG model. The two-dimensional projections are the elucidative cubic symmetry projections for identifying the double gyroid morphology as compared to structures based on other cubic space groups. The resemblance between the images in FIGS. 10a-f and those obtained by other investigators for double gyroid morphology (see Avgeropoulos, et al., "Tricontinuous Double Gyroid Cubic Phase in Triblock Copolymers of the ABA Type", *Macromolecules*, 30: pp. 5634-5642 (1997)) indicates that the present morphology shown in FIG. 10 is double gyroid.

Figure 11:
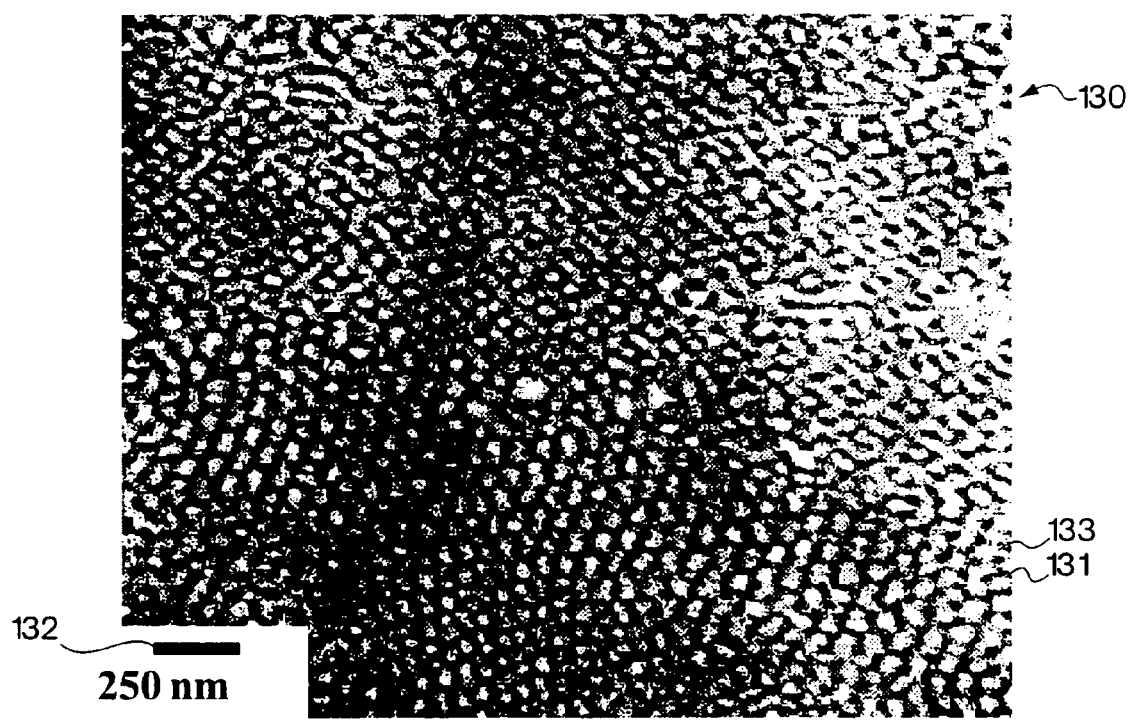
FIG. 11 is a photocopy of a bright field TEM image of a thin section of a three-dimensionally periodic polymeric article produced according to one embodiment of the invention.

FIG. 11 shows a bright field TEM image 130 of the tri-block copolymeric article comprised of the P(PMDSS)-b-PI-b-P(PMDSS) (BAB-4) copolymer produced according to Example 2. The scale 132 in the figure represents a length of 250 nm. The PI domains 131 in the figure appear dark, while the P(PMDSS) domains 133 appear bright. The sample exhibits a double gyroid 133 of P(PMDSS) in a PI matrix 131.

Example 4

Preparation of One- and Two Dimensionally Periodically Structured Polymeric Articles Microphase-separated polymeric articles were prepared from the BAB-2 and BAB-3 tri-block copolymers produced according to Example 2. The articles were prepared and their structures were analyzed as described above in Example 3.

Figure 12:
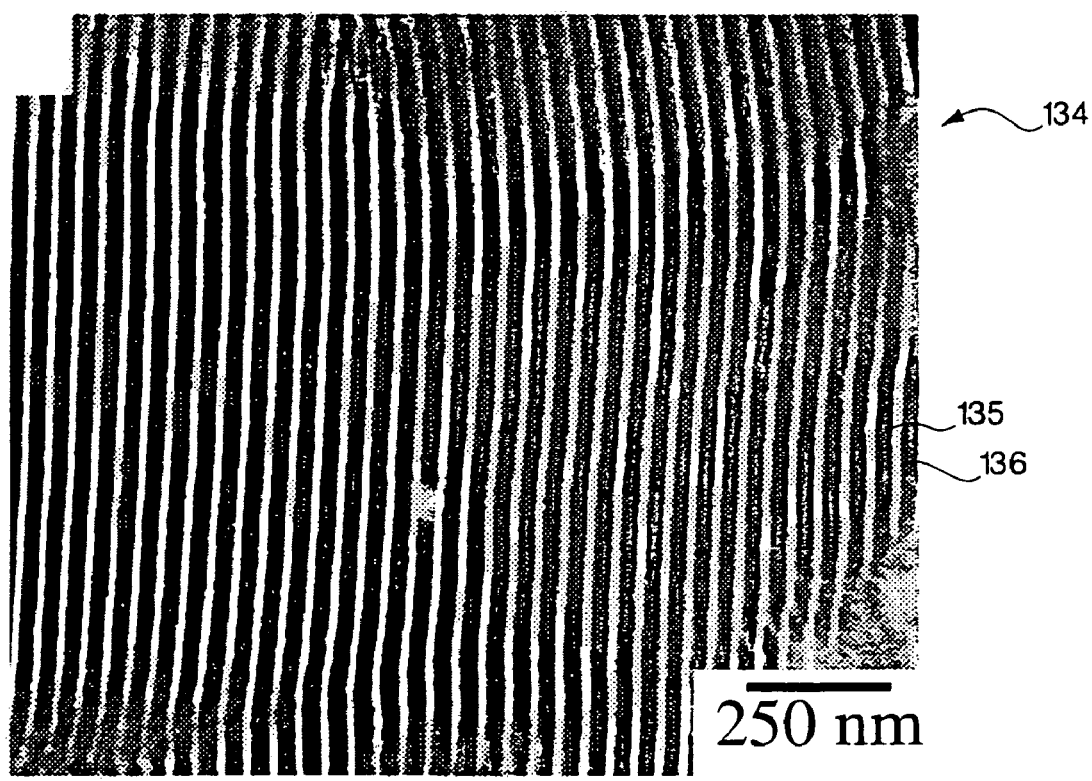
FIG. 12 is a photocopy of a bright field TEM image of a thin section of a one-dimensionally periodic polymeric article produced according to one embodiment of the invention.

FIG. 12 shows a bright field TEM image 134 of the one-dimensionally periodic lamellar tri-block copolymeric article comprised of the P(PMDSS)-b-PI-b-P(PMDSS) (BAB-2) copolymer produced according to Example 2. The scale 132 in the figure represents a length of 250 nm. The PI domains 135 in the figure appear dark, while the P(PMDSS) domains 136 appear bright and have a characteristic minimum dimension about half that of the PI domains.

Figure 13:
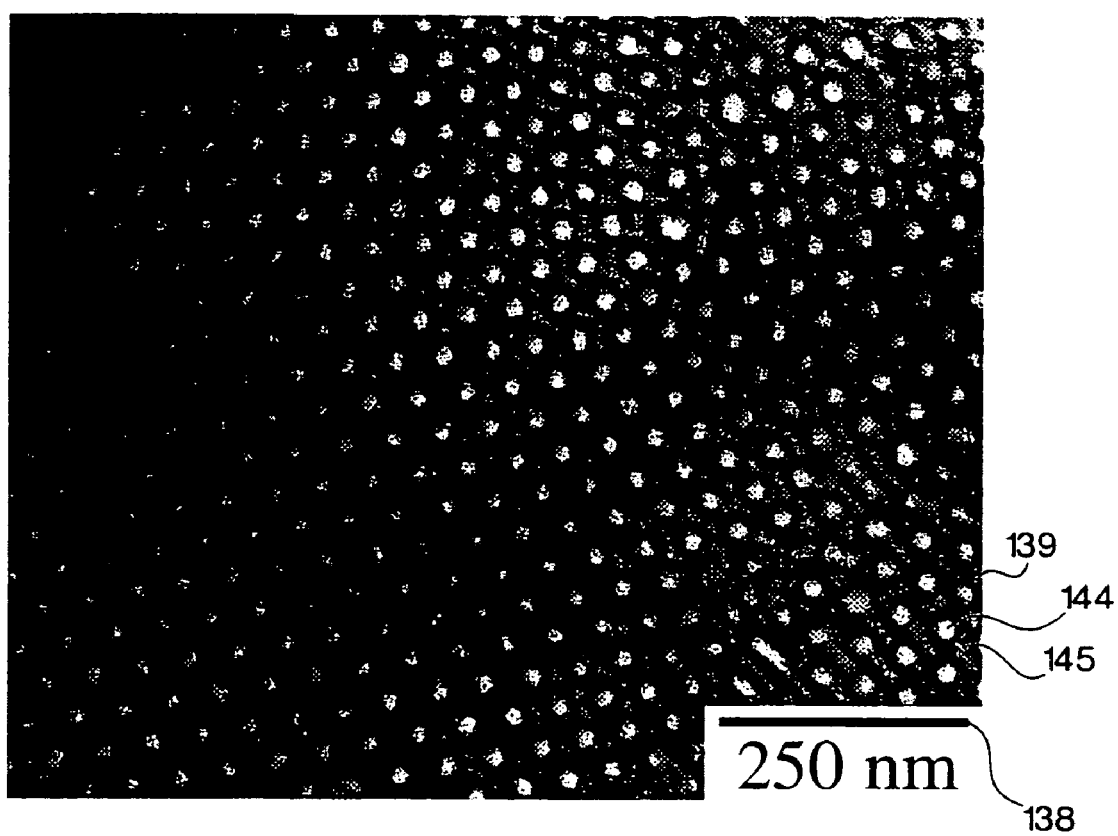
FIG. 13 is a photocopy of a bright field TEM image of a thin section of a two-dimensionally periodic polymeric article produced according to one embodiment of the invention.

FIG. 13 shows a bright field TEM image 137 of the tri-block copolymeric article comprised of the P(PMDSS)-b-PI-b-P(PMDSS) (BAB-3) copolymer produced according to Example 2. The scale 138 in the figure represents a length of 250 nm. The PI domains 139 in the figure appear dark, while the P(PMDSS) domains 144, 145 appear bright. The sample exhibits a two-dimensional periodicity comprising concentric cylinders with an inner P(PMDSS) core 144 surrounded by a ring 139 of PI disposed within a matrix 145 of P(PMDSS). in a PI matrix 131.

Example 5

Formation of a Porous Periodically Structured Article by Ozonolysis

Microtome-prepared unstained sections of microphase separated PI-b-P(PMDSS)-b-PI, 24/100/26 (ABA-1) triblock copolymers with double gyroid domain morphology were prepared as described in Example 3. The sections were exposed to a flowing 2% wt ozone atmosphere for one hour at room temperature in order to preferentially oxidize the PI-containing domains. After ozonolysis, the PI-oxidized fragments were removed from the sample by soaking the sample in deionized water overnight. The resulting structures were then examined by TEM at 100 kV.

Figure 14:
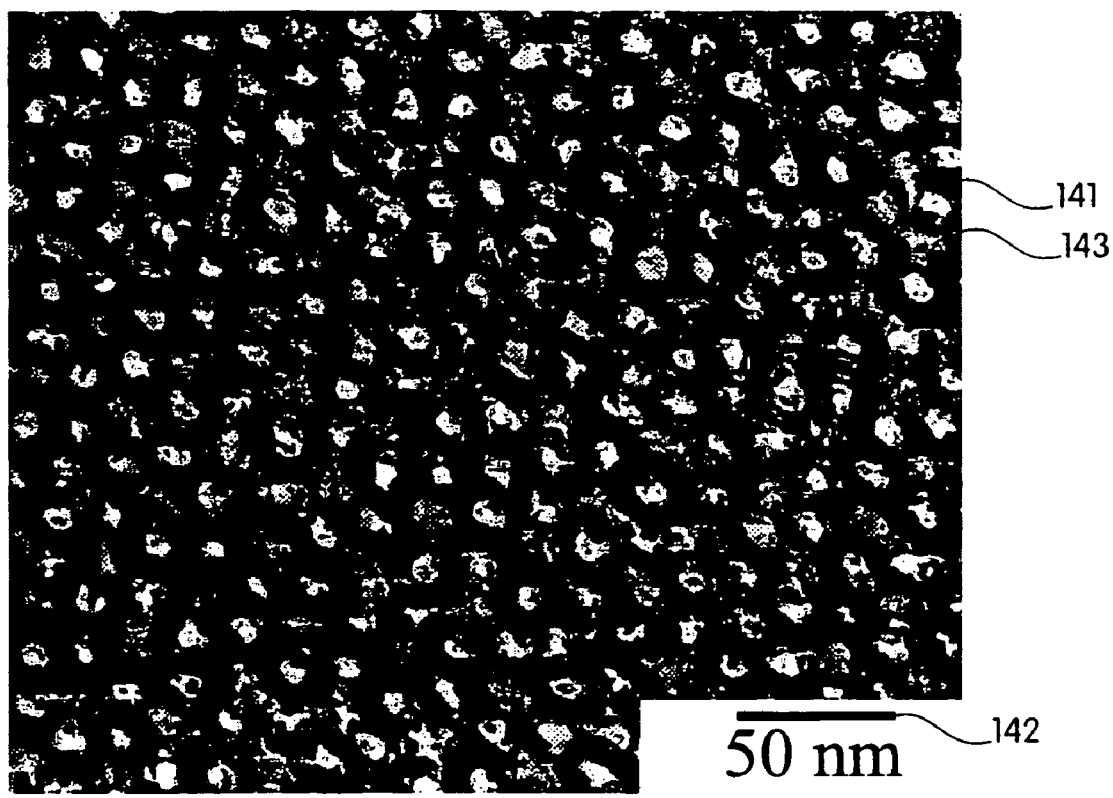
FIG. 14 is a photocopy of a bright field TEM image of a thin section of a three-dimensionally periodic polymeric porous article produced according to one embodiment of the invention.

FIG. 14 shows a bright field TEM image 140 of the unstained double gyroid sample after exposure to the ozone environment with subsequent removal of the PI polymeric blocks from the structure. The contrast in the FIG. 14 is due to the removal of the PI to yield domains 141 which are comprised of void space surrounded by a darker matrix 143 of P(PMDSS). The structure seen in the polymeric article (See Example 3) was preserved after exposure to ozone.

Example 6

Formation of a Porous Periodically Structured Article by Ozonolysis

Microphase-separated polymeric articles prepared from the ABA-1 tri-block copolymer produced according to Example 2, were prepared as described in Example 3, except that the copolymer was cast into a film that was approximately 1 mm thick (as opposed to 0.7 mm in Example 3), and the films were annealed at 120° C. for one week (as opposed to two weeks in Example 3). Thin sections of the annealed samples were prepared for observation with TEM as described above in Example 3. Simulations of the double gyroid morphology were also generated by a publicly available computer program (TEMsim, available at http://www.msri.org/people/staff/jim).

In addition, microtome-prepared unstained sections of the microphase separated ABA-1 tri-block copolymer were oxidized via ozonolysis, and the PI-containing domains were preferentially removed from the structure as described above in Example 5.

FIGS. 15a-15c show both the simulated and experimental views of the P(PMDSS)-DG double gyroid morphology obtained, as observed along the [110] direction. FIG. 15a shows a 3-dimensional surface view 150 of the double gyroid structure, as generated by the computer program simulation. The P(PMDSS) matrix has been made transparent in FIG. 15a to more clearly show the PI domain networks and the two-fold symmetry of the structure. FIG. 15b is a bright field TEM image 154, as viewed in the [110] direction of a stained microtome section that has not been exposed to ozonolysis. In TEM image 154, the PI domains 156 have been preferentially stained with $OsO_4$ and appear darker than the surrounding P(PMDSS) matrix. FIG. 15b shows that the two-fold symmetry and morphology predicted by the computer simulation shown in FIG. 12a is well correlated to the actual experimentally obtained morphology. FIG. 15c shows a similar TEM image 158 of an unstained section of the P(PMDSS)-DG sample, which was exposed to ozonolysis followed by preferential removal of the PI block from the structure. As a result of the removal of the PI domains, the contrast observed in FIG. 15b has been inverted in FIG. 15c, and the domains that were formed of PI in the precursor structure, which have been removed and now comprise void space 159, now appear lighter than the surrounding P(PMDSS) matrix 157. The images indicate that after preferential oxidation and removal of the PI domains, the periodic double gyroid structure is preserved.

Example 7

Formation of $SiO_x$ By Oxygen-RIE of Silicon-Containing Homopolymers

Oxygen-RIE was performed on the P(PMDSS) homopolymer prepared according to Example 2, and, for comparison a polystyrene (PS) homopolymer. Solutions of the polymers (5% wt. in toluene) were spun onto one inch silicon wafers still containing their native oxide. The thicknesses of the spun samples were 850 nm for PS and 200 nm for P(PMDSS). Etching was carried out in a low pressure, magnetically enhanced inductively coupled plasma etcher. Etching was performed with a base pressure of 10 mTorr and an oxygen flow rate of 40 standard cubic centimeters per minute (sccm). The top radio frequency (rf) generator was set at 250 W and the bottom rf generator at 50 W. Etching was carried out at 0 degrees C. for 60 seconds or 5 min.

Etch rates were calculated by measuring film thickness before and after etching using a profilometer. The atomic concentrations of silicon, carbon, and oxygen were estimated by X-ray photoelectron spectroscopy (XPS) for both etched and unetched samples. Analysis was performed with an ESCA spectrometer with a monochromatic Al K-alpha source (Model SSX-100 ESCA Spectrometer model 05. Surface Science Instruments, Mountain View, Calif.). 1000 eV survey spectra were recorded at 150 eV pass energy with a 1000 µm spot size for each sample. High resolution spectra (50 eV pass energy, 20-30 eV window) were recorded for carbon, oxygen, and silicon. Variable angle XPS studies were also conducted in order to estimate the degree of surface contamination. Data were taken at two detector-to-sample angles: 10 degrees and 60 degrees. The 10 degree data provide information about the top approximately 15 Å of the sample, while the 60 degree data provides information about the top approximately 75 Å of the sample. In addition, depth profiles of carbon, silicon, and oxygen concentration were obtained by Auger electron spectroscopy using a commercially available scanning Auger microprobe Model PHI 600, Physical Electronics, Inc). The electron energy used was 10 keV, and the electron current was 1 Amp. Sample sputtering for depth profiling was accomplished with a 3 keV argon ion beam over a 2×2 square millimeter raster.

The oxygen-RIE etch rates of the homopolymer films were approximately 800 and 15 nm/min for PS and P(PMDSS) films respectively, indicating an etch selectivity of approximately 50:1. Since the oxygen plasma reacts in a similar manner with all carbon atoms, the etch rates of PS and PI will be very similar.

Figure 16A:
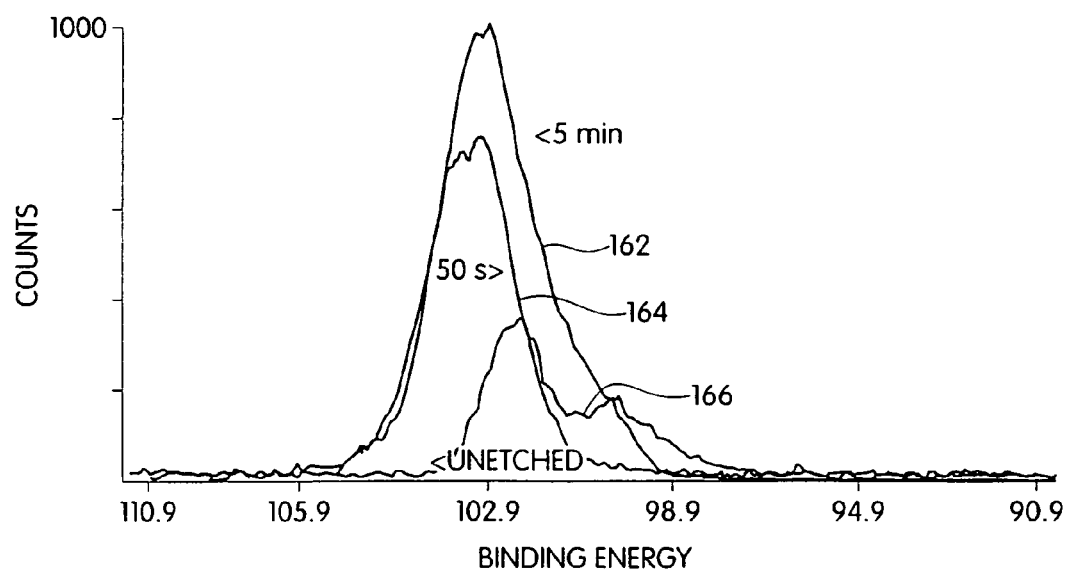
FIGS. 16a and 16b present plots of X-ray photoelectron spectroscopy data for polymers exposed to oxygen-RIE according to one aspect of the invention.
Figure 16B:
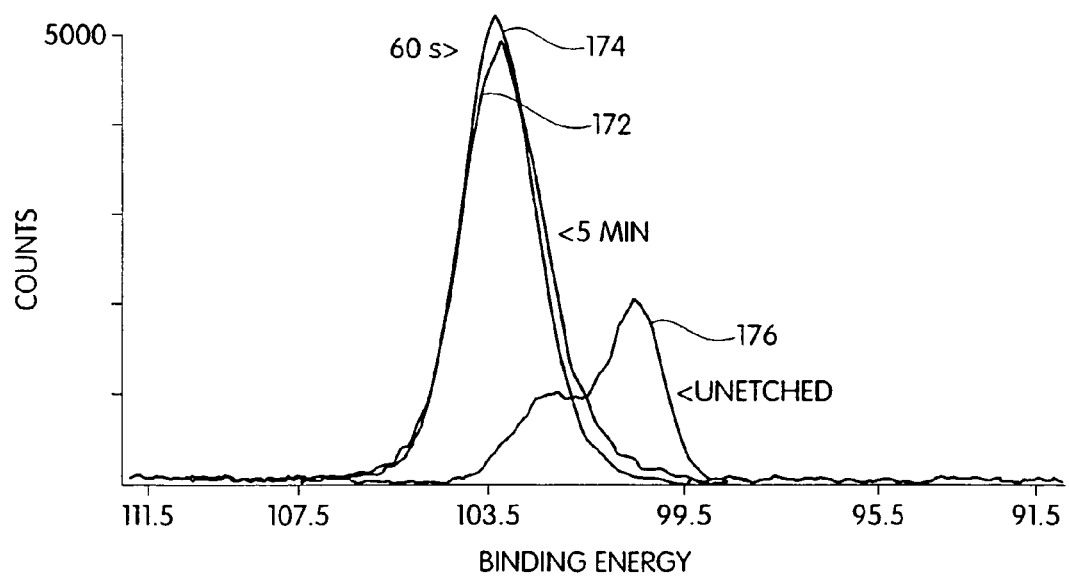

FIGS. 16a and 16b show plots of XPS data for etched and unetched P(PMDSS) samples monitoring the Si2p peak with data taken at a sample to detector angle of 10 degrees for FIG. 16a and at a sample to detector angle of 60 degrees for FIG. 16b. The data for the unetched samples at 10 degrees 166 and 60 degrees 176 indicates that in the unetched samples, the silicon exists primarily in a carbon-rich environment, as evidenced by a Si2p binding energy peak centered primarily between 100.5 to 101.8 eV. The data for films exposed to the oxygen plasma at 10 degrees (164 for 60 second exposure and 162 for 5 min exposure) and 60 degrees (174 for 60 second exposure and 172 for 5 min exposure) indicate that the amount of carbon present decreases significantly as the carbon in the polymer is removed by the oxygen plasma. This phenomenon is reflected in the XPS data as a dramatic increase in the silicon/carbon ratio signified by the marked shift in the Si2p binding energy peak from 100.5-101.8 eV to 103.5 eV indicating that the silicon near the surface of the film is converted to $SiO_2$. When the data for the etched sample is modeled as a thin surface layer of $SiO_x$ on top of an underlying carbon-rich film (i.e. all detected oxygen is silicon-bound, not carbon-bound), a ratio of oxygen/silicon of 1.8 is calculated at the outer surface of the etched samples.

Figure 17:
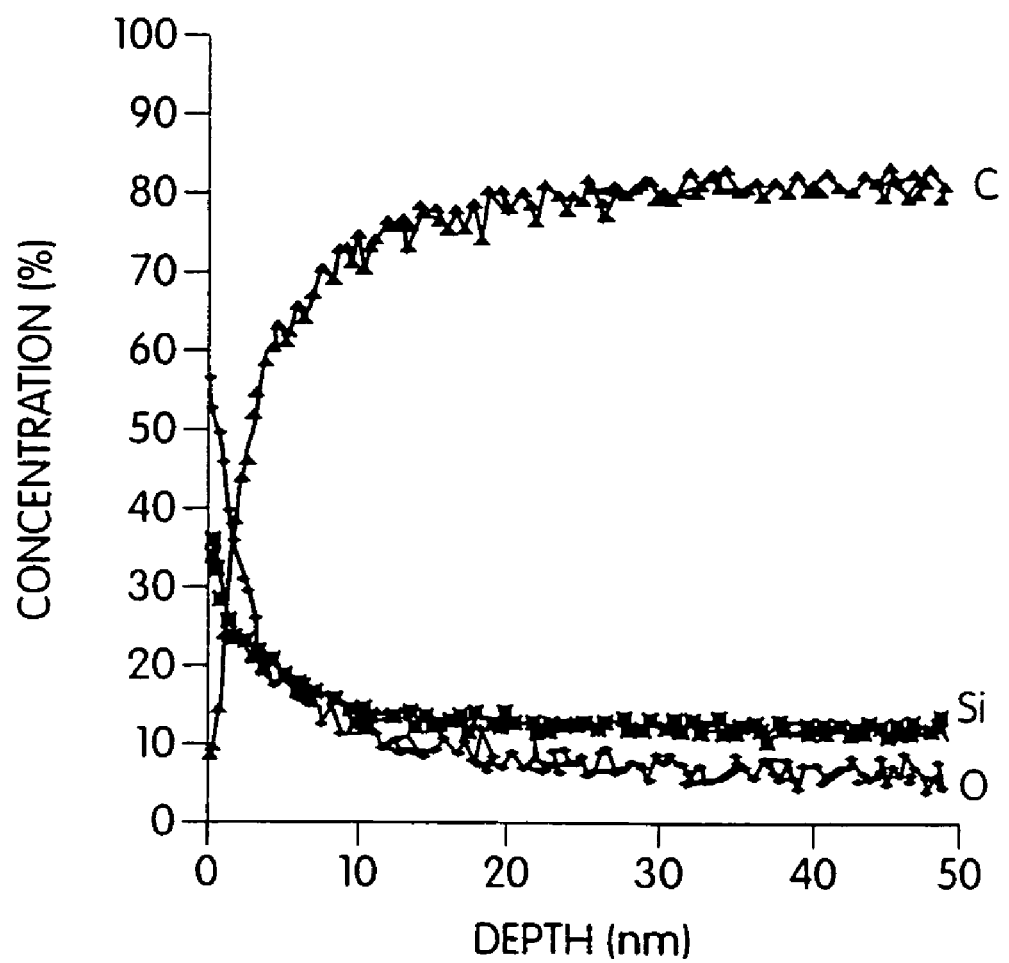
FIG. 17 presents AES spectra for polymers exposed to oxygen-RIE according to one aspect of the invention

FIG. 17 shows the AES spectra of P(PMDSS) samples etched for 60 seconds at 0 degrees C. The data support the XPS data and indicate a thin (about 5 nm thick) layer at the surface that is rich in silicon and oxygen and poor in carbon, with a ratio of silicon to oxygen at the surface indicative of the presence of $SiO_2$, and with the ratio increasing to that of the elemental distribution of the unetched polymer at increased depths within the sample.

Contact angle measurements were also made on P(PMDSS) samples before and after oxygen-RIE for 60 seconds at 0 degrees C. The surface free energies as calculated from the contact angle measurements were 42.0 ergs/cm² for unetched samples and 70.8 ergs/cm² for etched samples. The increase in surface free energy upon exposure to oxygen-RIE corroborate the XPS and AES data shown above. The higher surface free energy of the oxygen-RIE treated samples is consistent with an increase in surface polarity upon conversion of the silicon in the polymer to $SiO_x$.

Example 8

Formation of $SiO_x$ by a One-Step Oxidation Process Utilizing Ozone and UV Light Oxidation by ozonolysis and UV exposure was performed on the P(PMDSS) homopolymer prepared according to Example 2. The polymers were spun onto silicon wafers as described in Example 7, except that the thickness of the spun polymer samples for the present example was 700 nm.

The spin-coated P(PMDSS) homopolymers were then exposed to a flowing 2% ozone atmosphere, as previously described in Example 5, except that during the oxidation process, the sample was also continuously exposed to UV light (254 nm wavelength with an intensity of about 8 mW/cm² at a distance of about 0.75 in from the light source) for one hour.

After exposure to ozonolysis and UV exposure for one hour, the Si2p peak of the homopolymer sample changed from bout 100.7 eV to about 103 eV indicating that silicon had been converted to $SiO_x$. This was confirmed by results obtained via Rutherford backscattering (RBS) indicating that the stoichiometry of the polymer film changed from that of P(PMDSS) to $SiO_2$. Furthermore, the refractive index of the material was observed to change from about 1.56 to about 1.42 (essentially equal to that of $SiO_2$). Samples of the spun-cast homopolymer, and the spun-cast homopolymer oxidized by ozonolysis and UV exposure, were also exposed to a temperature of 400° C. for one hour, after which the refractive index, thickness, and appearance of the sample was observed. After exposure to 400° C. for one hour, the refractive index, thickness, and appearance of the oxidized films were essentially unchanged. In contrast, the unoxidized homopolymer films were observed to crack and degrade after the above exposure to elevated temperature. These results demonstrate that the low-temperature ozone combined with UV oxidation process can yield a thermally stable inorganic oxide upon treatment of a polymer including a species capable of forming a ceramic oxide, such as silicon.

Example 9

Formation of a Porous Periodically Structured Ceramic Article by a One-Step Process Utilizing Ozone and UV Light Microphase-separated P(PMDSS)-DG polymeric articles were prepared from the ABA-1 tri-block copolymer produced according to Example 2. 700 nm thick films of the phase-separated block copolymers were prepared by spin-coating the polymer solutions onto silicon wafers as in Example 8.

The spun-cast polymer film was then annealed for two days in a vacuum oven at 120° C. The spin-coated copolymer samples were then exposed to a flowing 2% ozone atmosphere and UV light, as described in Example 8. The samples were then soaked in deionized water overnight in order to remove the degraded PI domains.

The oxidation conditions discussed above promoted the conversion of the silicon in the silicon-containing block to silicon dioxide. This was determined by analyzing the treated sample via X-ray photoelectron spectroscopy (XPS) and Rutherford backscattering (RBS), as discussed above in Example 8.

Figure 18B:
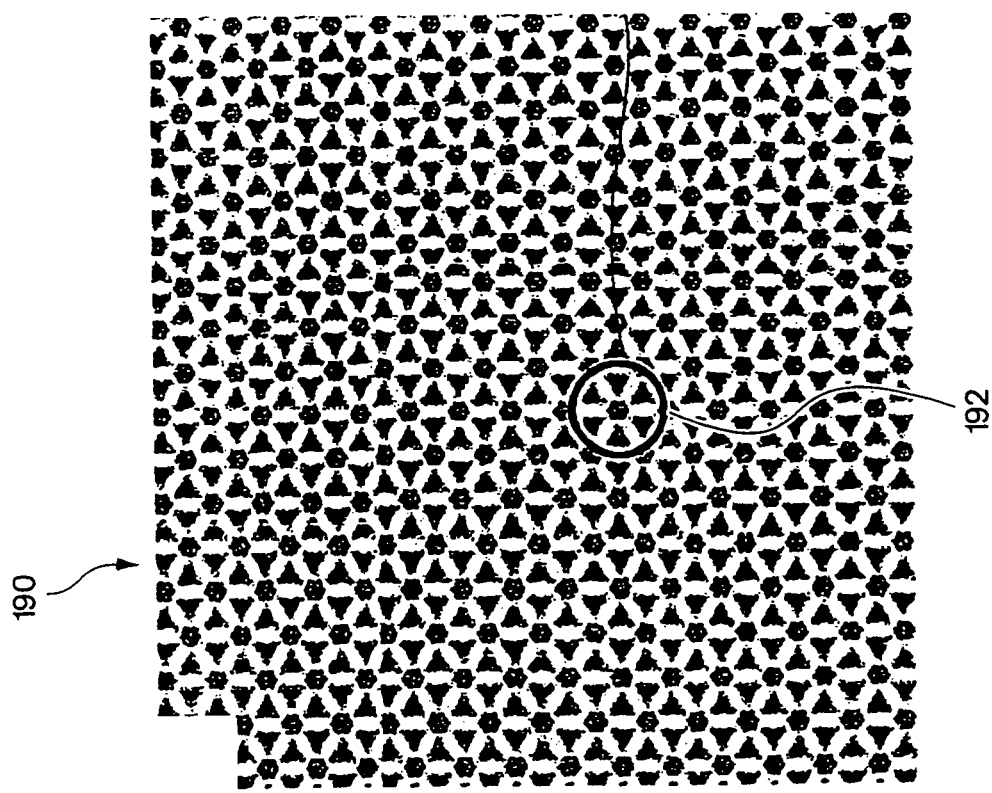
FIG. 18b is a photocopy of a computer simulated image of a three-dimensionally periodic ceramic porous article produced according to one embodiment of the invention.
Figure 18A:
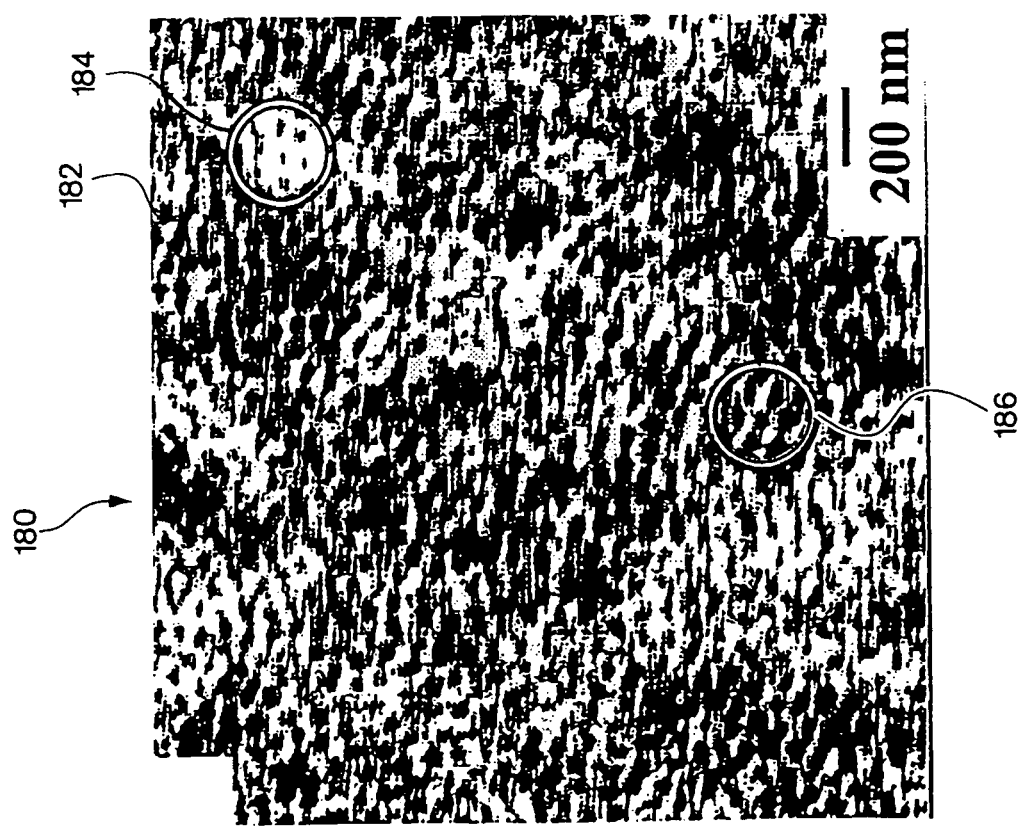
FIG. 18a is a photocopy of an AFM image of a sample of a three-dimensionally periodic ceramic porous article produced according to one embodiment of the invention.

Samples of the oxidized spin-coated block copolymer were also subjected to morphological analysis with atomic force microscopy (AFM) using intermittent contact mode using a Digital Nanoscope III or a Digital Nanoscope 2000 atomic force microscope. FIG. 18a shows an AFM image 180 of the spin-coated P(PMDSS)-DG after oxidation by ozone and UV exposure. The PI domains have been selectively removed leaving uniform pores 182 in their place that are approximately 35 nm in diameter, which is well correlated to the PI domain size previously observed in TEM image 154, shown in FIG. 15 b, of the stained, unoxidized, P(PMDSS)-DG block copolymer sample. FIG. 18b shows a computer generated TEMsim image 190 of the [111] projection of the corresponding double gyroid structure. FIG. 18b clearly shows the three-fold symmetry of the double gyroid morphology. Comparing the simulated image 190 of FIG. 18b with AFM image 180 of FIG. 18a shows that there is a strong correlation between the two (compare the regions contained circled areas 184 and 186 of FIG. 18a, and circled area 192 of FIG. 18b).

Example 10

Formation of a Periodically Structured Relief Ceramic Article by a One-Step Process Utilizing Ozone and UV Light Microphase-separated polymeric articles were prepared from the ABA-2 block copolymers produced according to Example 2 by spin-casting and annealing as in Example 9. The resultant PI-DG structures were then subjected to simultaneous ozone/UV oxidation, followed by analysis of the resulting structures by XPS, RBS, and AFM analysis, as described in Example 9.

Figure 19B:
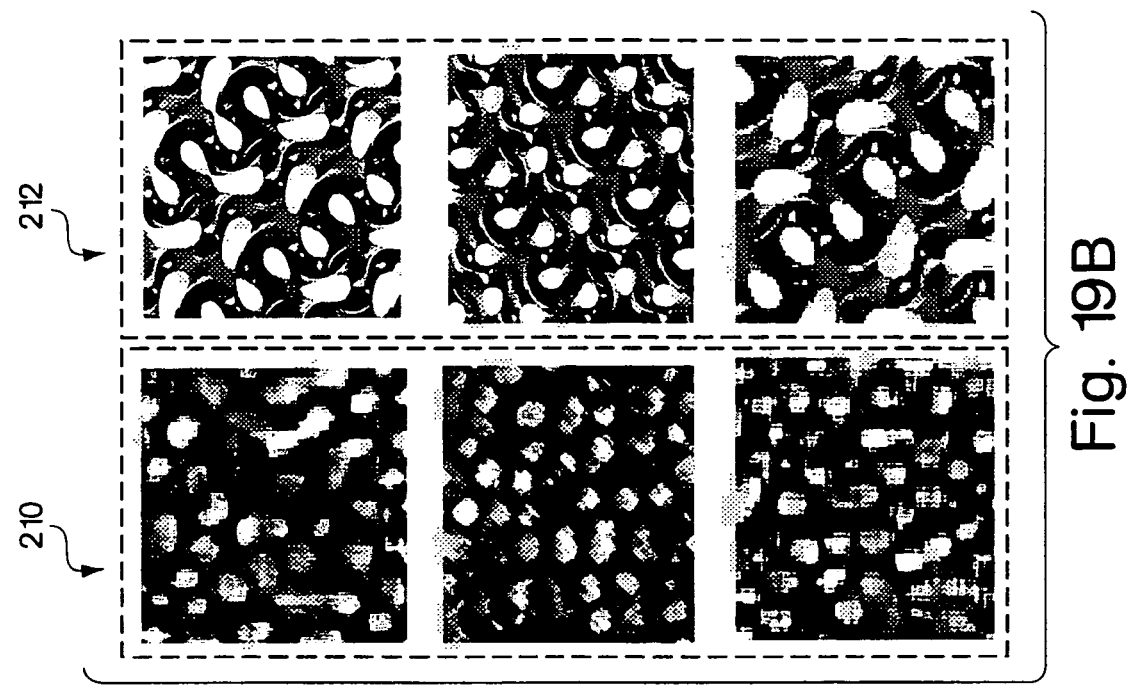
FIG. 19b is a photocopy of a panel of AFM images of the sample of FIG. 19a and their corresponding computer simulated images.
Figure 19A:
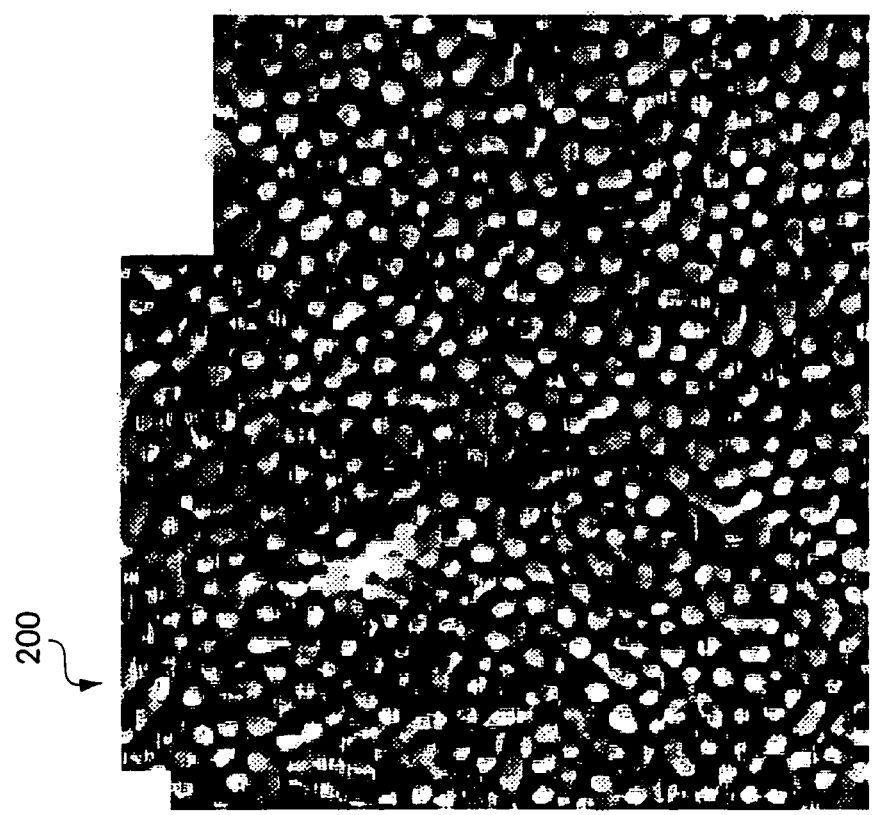
FIG. 19a is a photocopy of an AFM image of a sample of a three-dimensionally periodic ceramic relief article produced according to one embodiment of the invention.

FIG. 19a shows an AFM image 200 of a PI-DG sample after oxidation by ozone and UV. As expected, there was an inversion in contrast when compared to AFM image 180 of FIG. 18a, which shows the oxidized P(PMDSS)-DG sample. This reversal in contrast is due to the selective removal of the PI matrix domains of the PI-DG sample via oxidation, leaving behind $SiO_x$ relief domains to be imaged. The double gyroid morphology of the containing relief structure resulted in the presence of triple point junctions 202 and the three-fold symmetry of the structure (see for example circled area 204) apparent in FIG. 19a. FIG. 19b shows a direct comparison of regions imaged by AFM 210 and corresponding [111] views 212 of the double gyroid relief structure generated by computer simulation. FIG. 19*b* indicates that the structure observed via AFM was closely approximated by the computer simulation of the [111] views of the corresponding double gyroid relief structures.

Prophetic Example 1

Formation of a Porous Periodically Structured Ceramic Article By a Two-step Oxidation Procedure Microtome-prepared unstained sections of microphase separated PI-b-P(PMDSS)-b-PI (ABA) tri-block copolymers with double gyroid domain morphology were prepared as described in Example 3. Two samples are prepared. The first sample is exposed to ozone in order to oxidize and remove the PI polymeric blocks as previously described in Example 5. The second sample is exposed to ozone in order to oxidize and remove the PI polymeric blocks as previously described in Example 5, except that during the oxidation process, the sample is also continuously exposed to UV light (254 nm wavelength with an intensity of about 8 mW/cm$^2$ at a distance of about 0.75 inch from the light source).

Both samples are subsequently exposed to oxygen-RIE under similar conditions as those described for homopolymers in Example 7. Morphological characterization is carried out using TEM as described in Example 5, and analysis of carbon, silicon, and oxygen concentrations is performed using Rutherford Backscattering (RBS), or XPS and AES as described in Example 6.

Results indicate that periodically structured ceramic articles result, each having the same domain microstructure as the precursor polymeric article from which they are derived. The resulting articles have domains comprised of void space in the place of the oxidized and removed precursor PI polymeric species. The interfacial surface of the domains derived from oxidized P(PMDSS) contain a region at the interface about 5 nm thick which is relatively depleted of carbon and relatively enriched in silicon and oxygen (compared to the atomic distribution of molecular P(PMDSS)) indicative of the presence of an SiO$_x$ inorganic ceramic layer.

Prophetic Example 2

Formation of a Porous Periodically Structured Ceramic Article By a One-step Process Utilizing Oxygen-RIE Microtome-prepared unstained sections of microphase separated PI-b-P(PMDSS)-b-PI (ABA) tri-block copolymers with double gyroid domain morphology were prepared as described in Example 3. The sample is then exposed to oxygen-RIE as previously described in Example 7.

Morphological characterization is carried out using TEM as described in Example 5, and analysis of carbon, silicon, and oxygen concentrations is performed using XPS and AES as described in Example 7.

Results indicate that periodically structured ceramic articles result from the sample, which articles having the same domain microstructure as the precursor polymeric article from which it is derived. The resulting articles have domains comprised of void space in the place of the oxidized and removed precursor PI polymeric species. The interfacial surface of the domains derived from oxidized P(PMDSS) contain a region at the interface about 5 nm thick which is relatively depleted of carbon and relatively enriched in silicon and oxygen (compared to the atomic distribution of molecular P(PMDSS)) indicative of the presence of an SiO$_x$ inorganic ceramic layer.

Those skilled in the art would readily appreciate that all parameters listed herein are meant to be exemplary and that actual parameters will depend upon the specific application for which the methods and apparatus of the present invention are used. It is, therefore, to be understood that the foregoing embodiments are presented by way of example only and that, within the scope of the appended claims and equivalents thereto, the invention may be practiced otherwise than as specifically described. The present invention is directed to each individual feature, article, or method described herein. In addition, any combination of two or more such features, articles, or methods, provided that such features, articles, or methods are not mutually inconsistent, is included within the scope of the present invention.

The invention claimed is:

1. A system comprising:
a polymeric article including a three-dimensionally periodic structure of a plurality of periodically occurring separate domains, with at least a first and a second domain each being topologically continuous, and with said first domain comprising a polymeric species containing an inorganic species capable of forming a ceramic oxide, said inorganic species present in an amount of at least about 3 atomic % based on the total number of atoms in the first domain.

2. The system of claim 1, wherein the first and second domains of the polymeric article comprise a block copolymeric species having at least two blocks A and B that are assembled into the first and second domains respectively.

3. The system of claim 1, wherein said polymeric species has a glass transition temperature of at least about 0 degrees C.

4. The system of claim 1, wherein the polymeric species comprise polymers having an average molecular weight of at least about 30,000 Da.

* * * * *